(12) United States Patent
Baenninger et al.

(10) Patent No.: US 9,209,031 B2
(45) Date of Patent: Dec. 8, 2015

(54) METAL REPLACEMENT PROCESS FOR LOW RESISTANCE SOURCE CONTACTS IN 3D NAND

(71) Applicant: SanDisk Technologies Inc., Plano, TX (US)

(72) Inventors: Matthias Baenninger, Menlo Park, CA (US); Johann Alsmeier, San Jose, CA (US); Akira Matsudaira, San Jose, CA (US); Jayavel Pachamuthu, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 118 days.

(21) Appl. No.: 14/200,426

(22) Filed: Mar. 7, 2014

(65) Prior Publication Data

US 2015/0255481 A1    Sep. 10, 2015

(51) Int. Cl.

| H01L 21/28 | (2006.01) |
| H01L 27/115 | (2006.01) |
| H01L 29/66 | (2006.01) |
| H01L 21/225 | (2006.01) |
| H01L 21/306 | (2006.01) |
| H01L 21/02 | (2006.01) |
| H01L 21/311 | (2006.01) |

(52) U.S. Cl.
CPC .... *H01L 21/28282* (2013.01); *H01L 21/02587* (2013.01); *H01L 21/2251* (2013.01); *H01L 21/306* (2013.01); *H01L 21/31111* (2013.01); *H01L 27/1157* (2013.01); *H01L 27/11582* (2013.01); *H01L 29/66666* (2013.01); *H01L 29/66833* (2013.01)

(58) Field of Classification Search
None
See application file for complete search history.

(56) References Cited

U.S. PATENT DOCUMENTS

| 8,198,672 | B2 | 6/2012 | Alsmeier |
| 8,508,997 | B2 | 8/2013 | Tang et al. |
| 2010/0090188 | A1 | 4/2010 | Futatsuyama |
| 2012/0098139 | A1 | 4/2012 | Chae et al. |
| 2013/0126957 | A1 | 5/2013 | Higashitani et al. |
| 2013/0178048 | A1 | 7/2013 | Sun et al. |
| 2013/0264631 | A1 | 10/2013 | Alsmeier et al. |
| 2013/0294167 | A1 | 11/2013 | Li et al. |
| 2015/0091096 | A1* | 4/2015 | Shin ................... G11C 11/5621 257/390 |

OTHER PUBLICATIONS

Arya, Pranav, "3D NAND Flash Memory," IEE5008 Memory Systems, Autumn 2012, 43 pages.

(Continued)

*Primary Examiner* — Bilkis Jahan
*Assistant Examiner* — Kevin Quinto
(74) *Attorney, Agent, or Firm* — Vierra Magen Marcus LLP

(57) ABSTRACT

A fabrication process is provided for a 3D stacked non-volatile memory device which provides a source contact to memory holes at a bottom of a stack. The stack includes alternating control gate layers and dielectric layers on a substrate, and memory holes are etched through the stack. The process avoids the need to etch through films at the bottom of the memory hole. Instead, a path is formed from the bottom of the memory hole to the top of the stack. The path includes a horizontal portion using a voided trench in a substrate dielectric, and a passageway etched in the stack. The memory films, a channel material and a dielectric material are deposited throughout the interior surfaces of the void and the memory holes concurrently. The path is filled with metal to form a continuous, low resistance conductive path.

20 Claims, 29 Drawing Sheets

(56) References Cited

OTHER PUBLICATIONS

Komori, Y., et al., "Disturbless flash memory due to high boost efficiency on BiCS structure and optimal memory film stack for ultra high density storage device," IEEE Explore Digital Library, published in IEEE International Electron Devices Meeting, Dec. 15-17, 2008, 2 pages.

Katsumata, Ryota, et al., "Pipe-shaped BiCS Flash Memory with 16 Stacked Layers and Multi-Level-Cell Operation for Ultra High Density Storage Devices," Symposium on VLSI Technology Digest of Technical Papers, Jun. 16-18, 2009, 2 pages.

Nitayama, Akihiro, et al., "Bit Cost Scalable (BiCS) Flash Technology for Future Ultra High Density Storage Devices," International Symposium on VLSI Technology Systems and Applications (VLSI-TSA), Apr. 26-28, 2010, 2 pages.

Yanagihara, Yuki, et al., "Control Gate Length, Spacing and Stacked Layer Number Design for 3D-Stackable NAND Flash Memory," 4th IEEE International Memory Workshop (IMW), May 20-23, 2012, 4 pages.

Ishiduki, Megumi, et al., "Optimal Device Structure for Pipe-shaped BiCS Flash Memory for Ultra High Density Storage Device with Excellent Performance Reliability," IEEE International Electron Devices Meeting (IEDM), Dec. 7-9, 2009, 4 pages.

Chen, Yi-Wei, et al., "Scaling Tungsten Contact Metal Formation for 28 nm CMOS Logic Fabrication," UMC, Customer-Driven Foundry Solutions, Oct. 7, 2010, 19 pages.

International Search Report & The Written Opinion of the International Searching Authority dated Jun. 9, 2015, International Application No. PCT/US2015/018774.

* cited by examiner

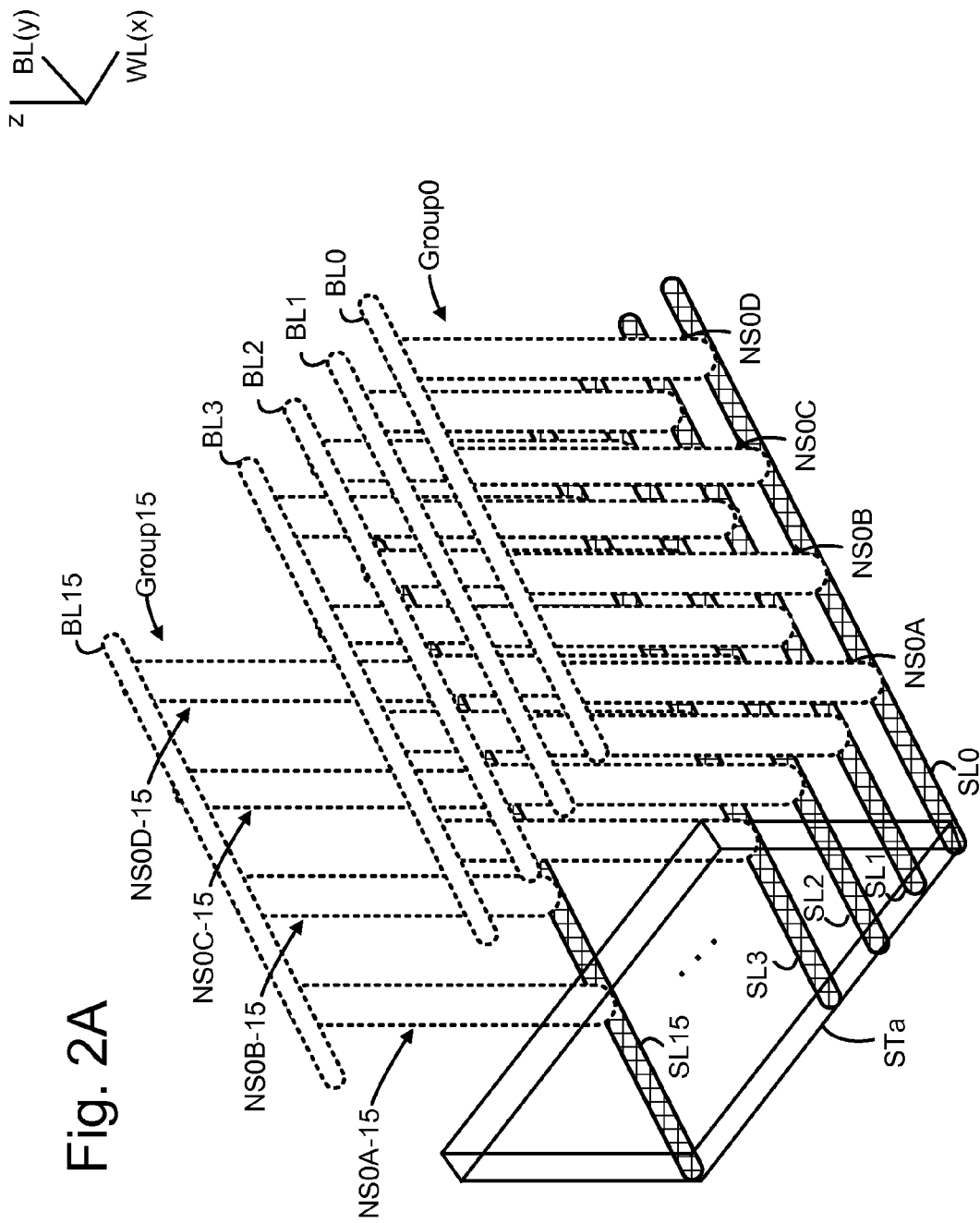

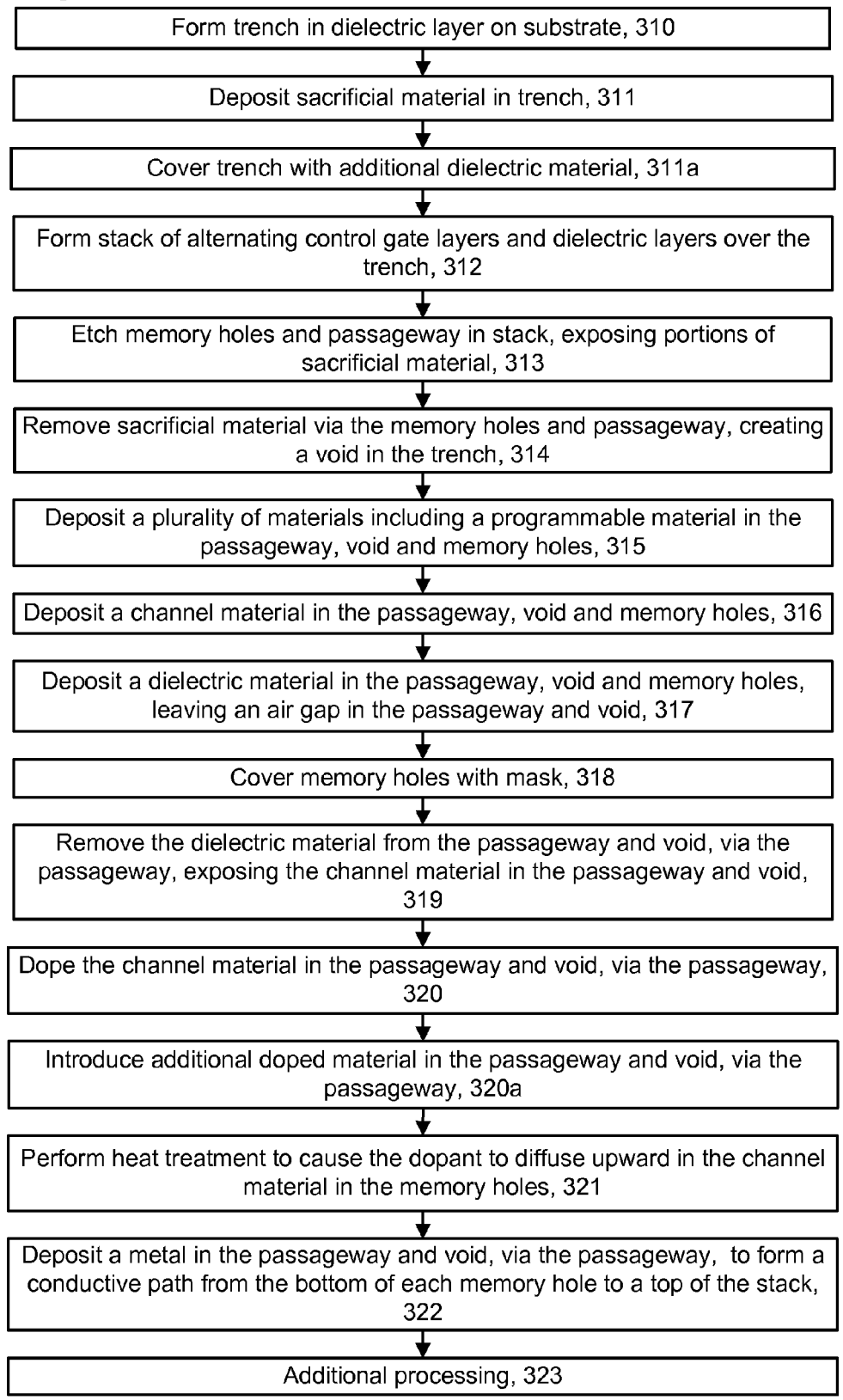

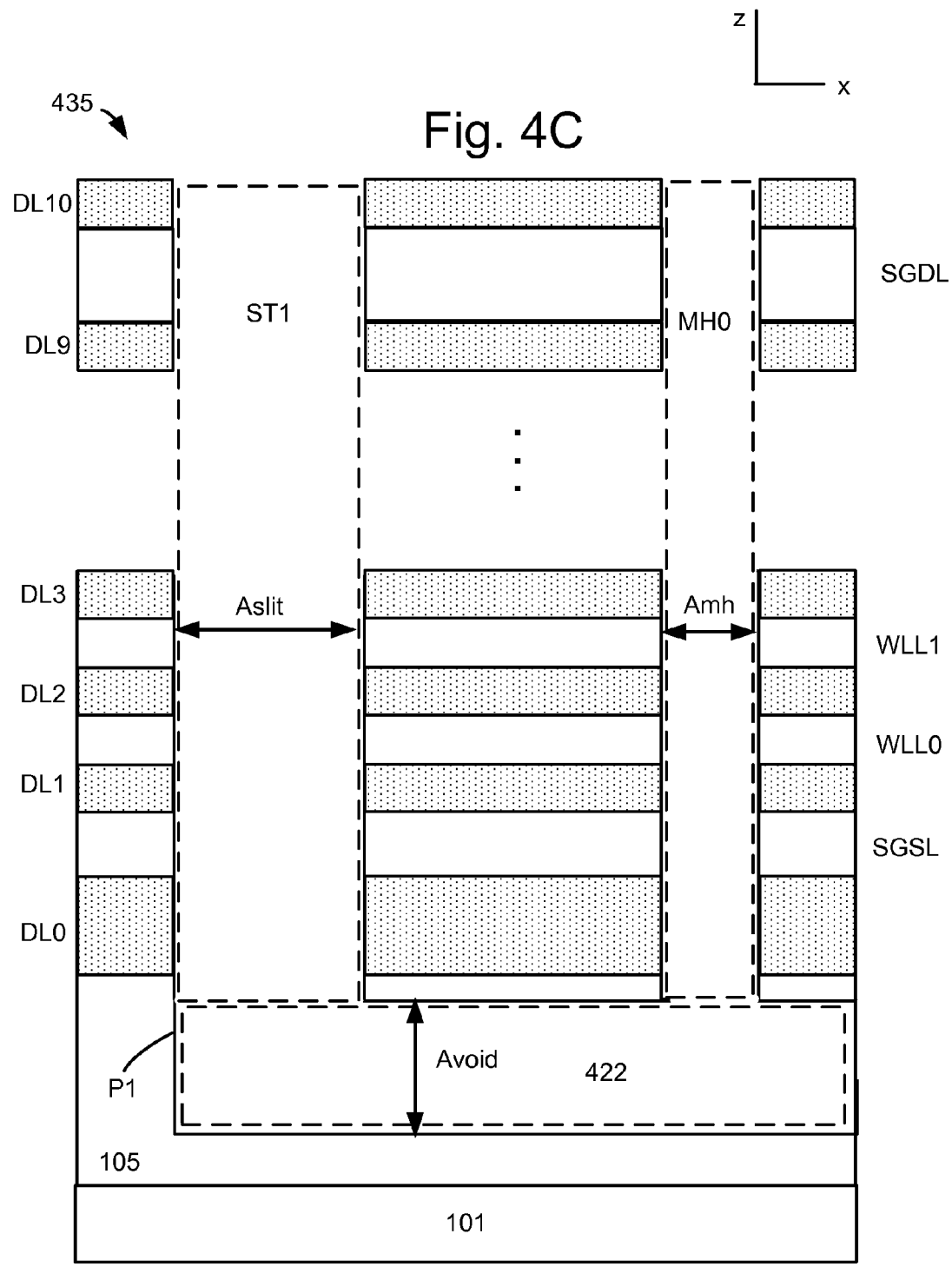

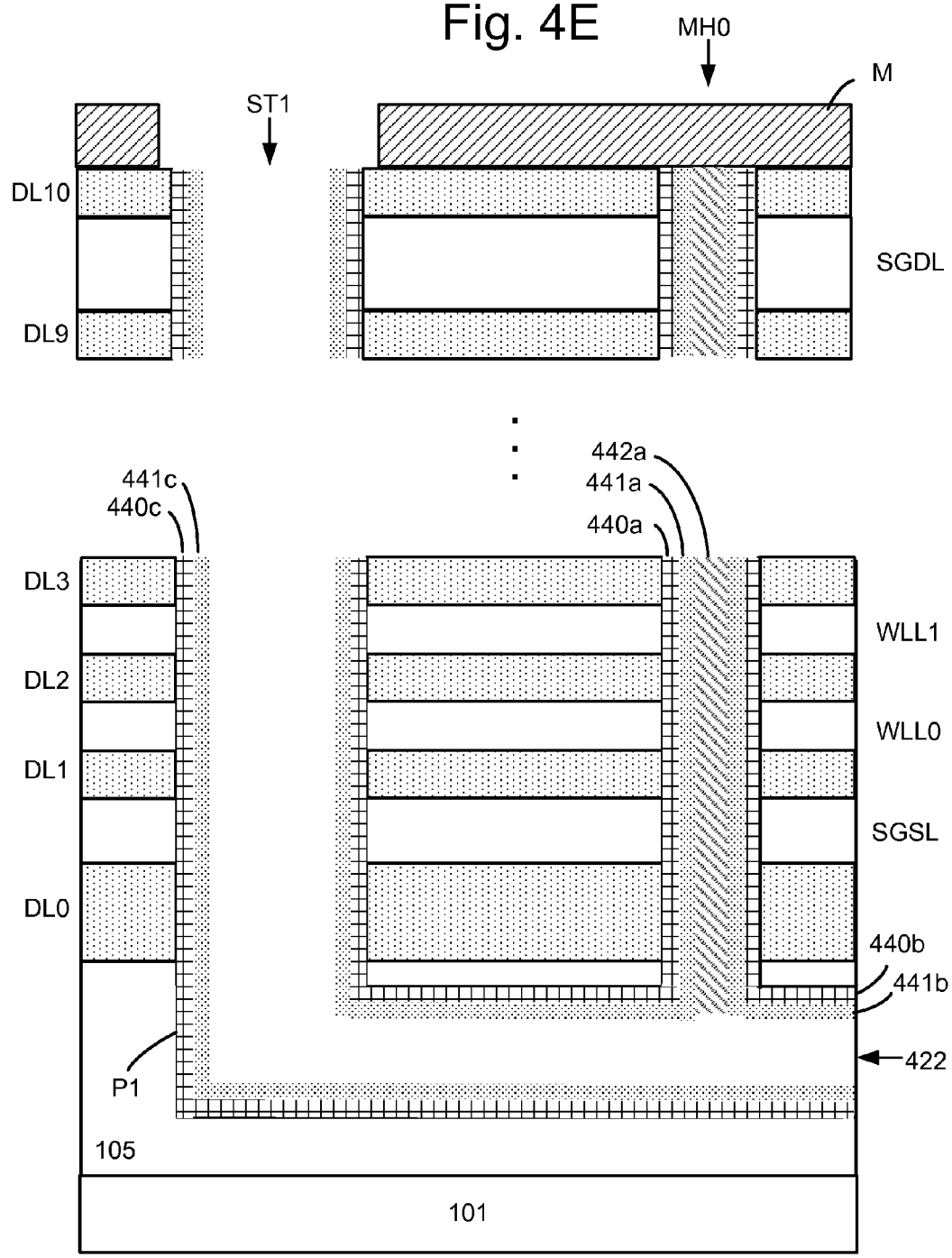

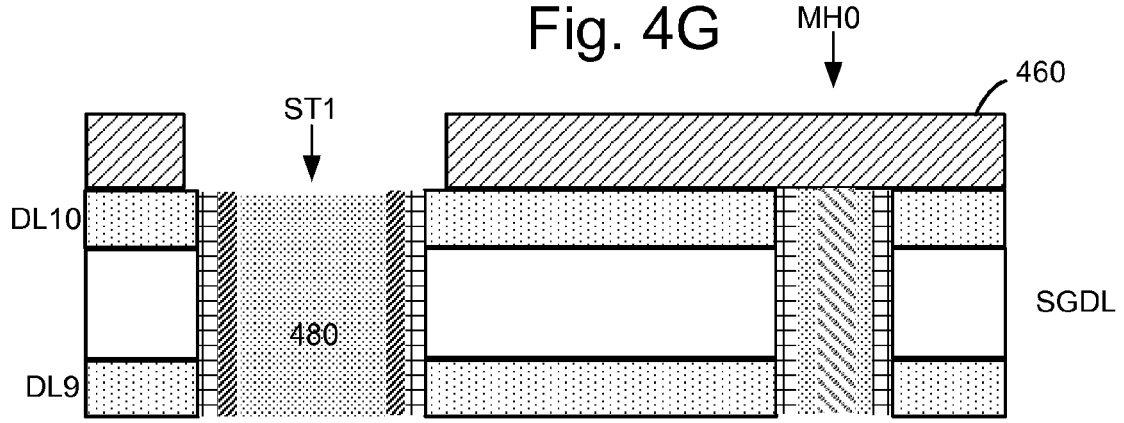
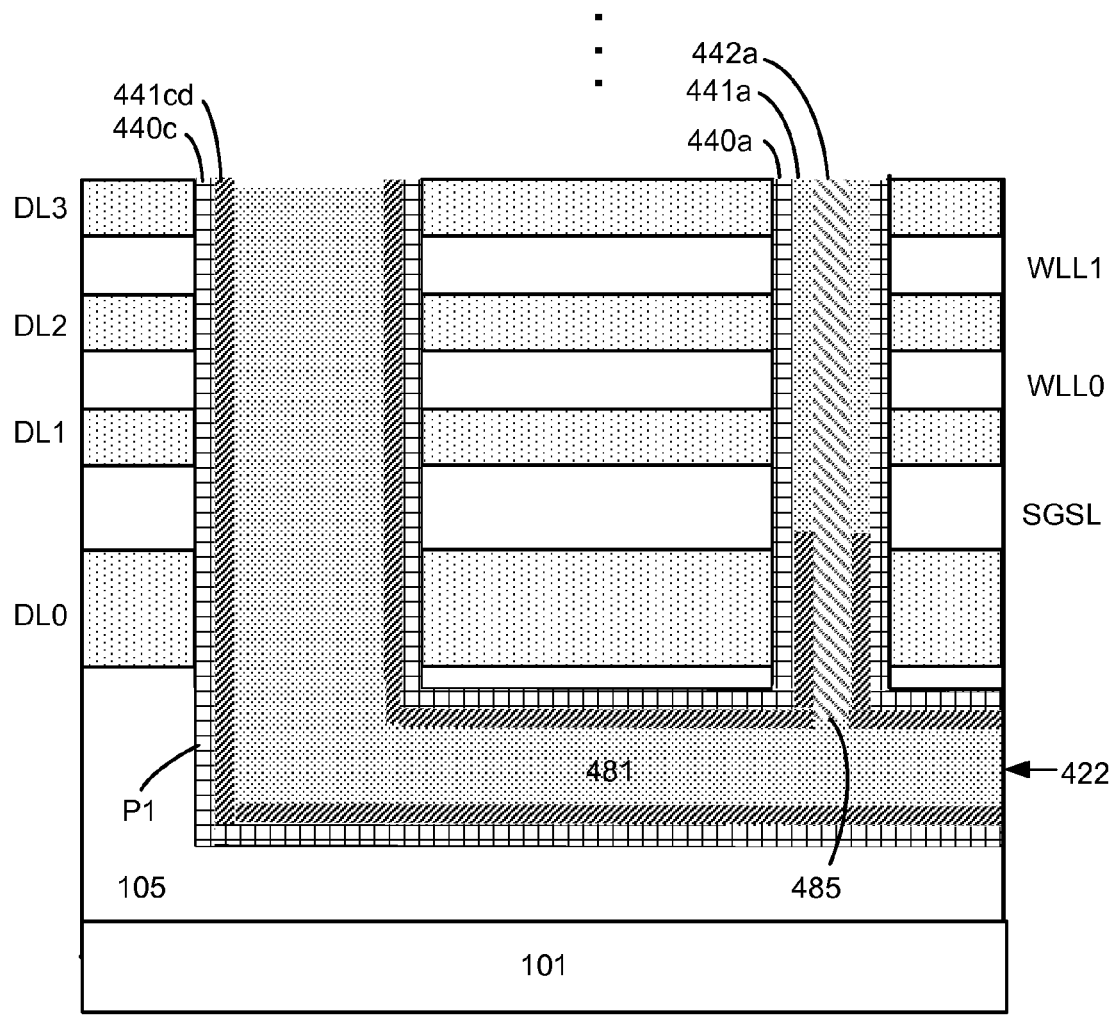
Fig. 4G

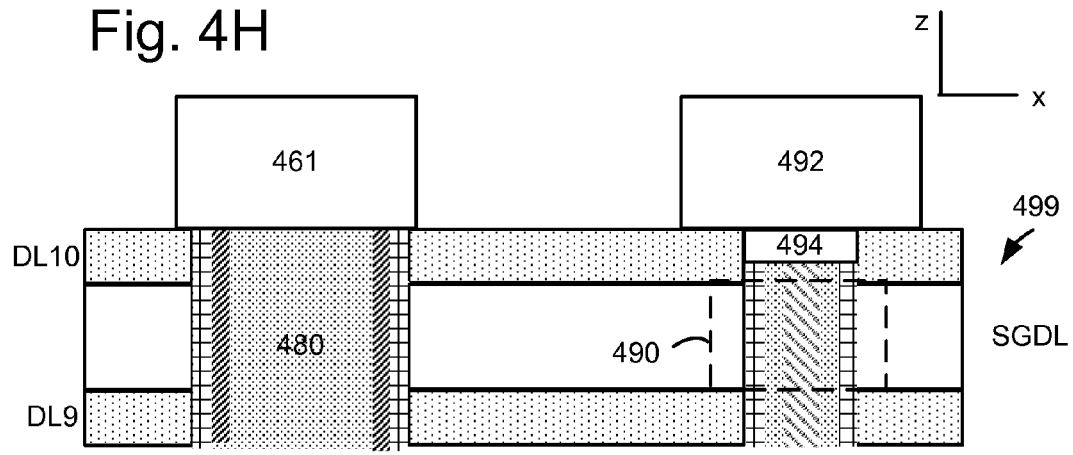
Fig. 4H
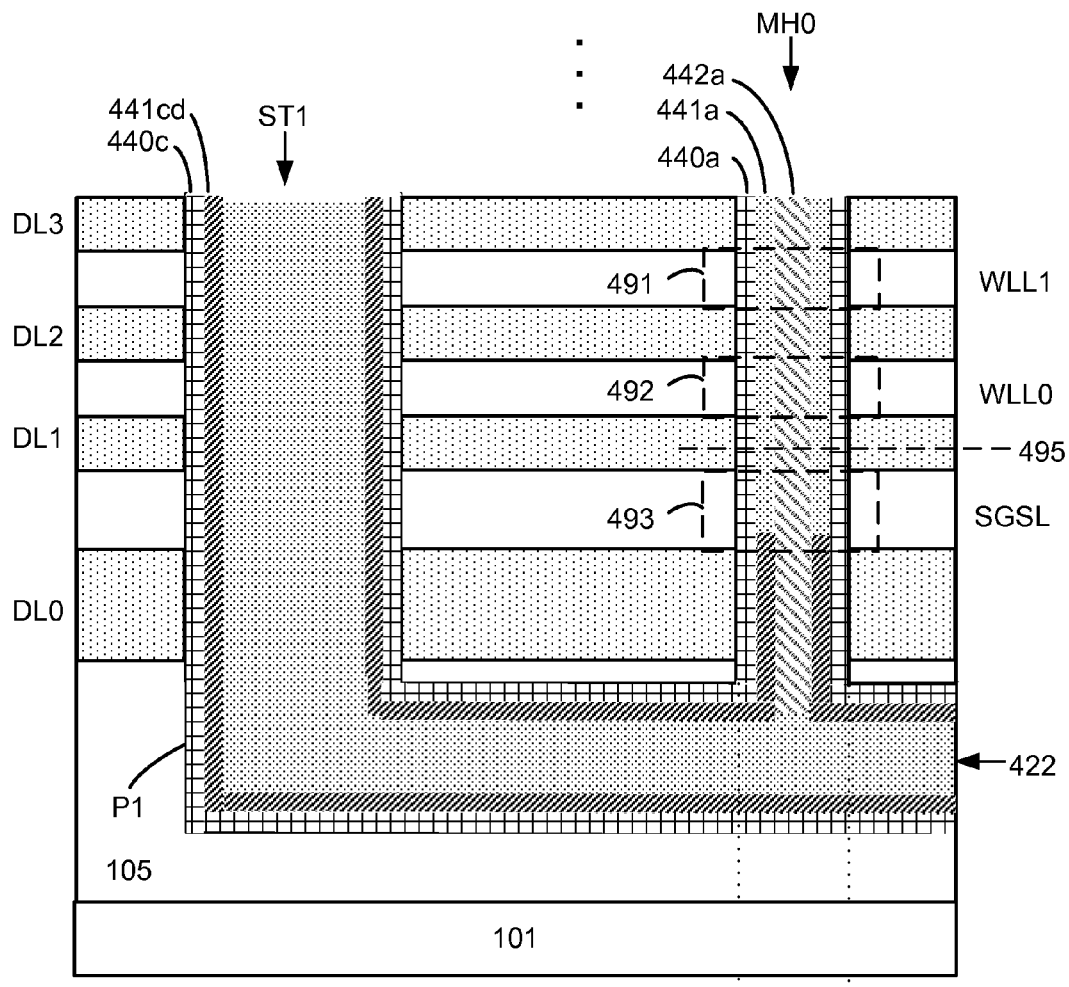
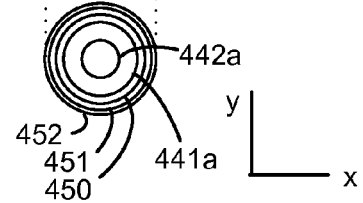
Fig. 4I

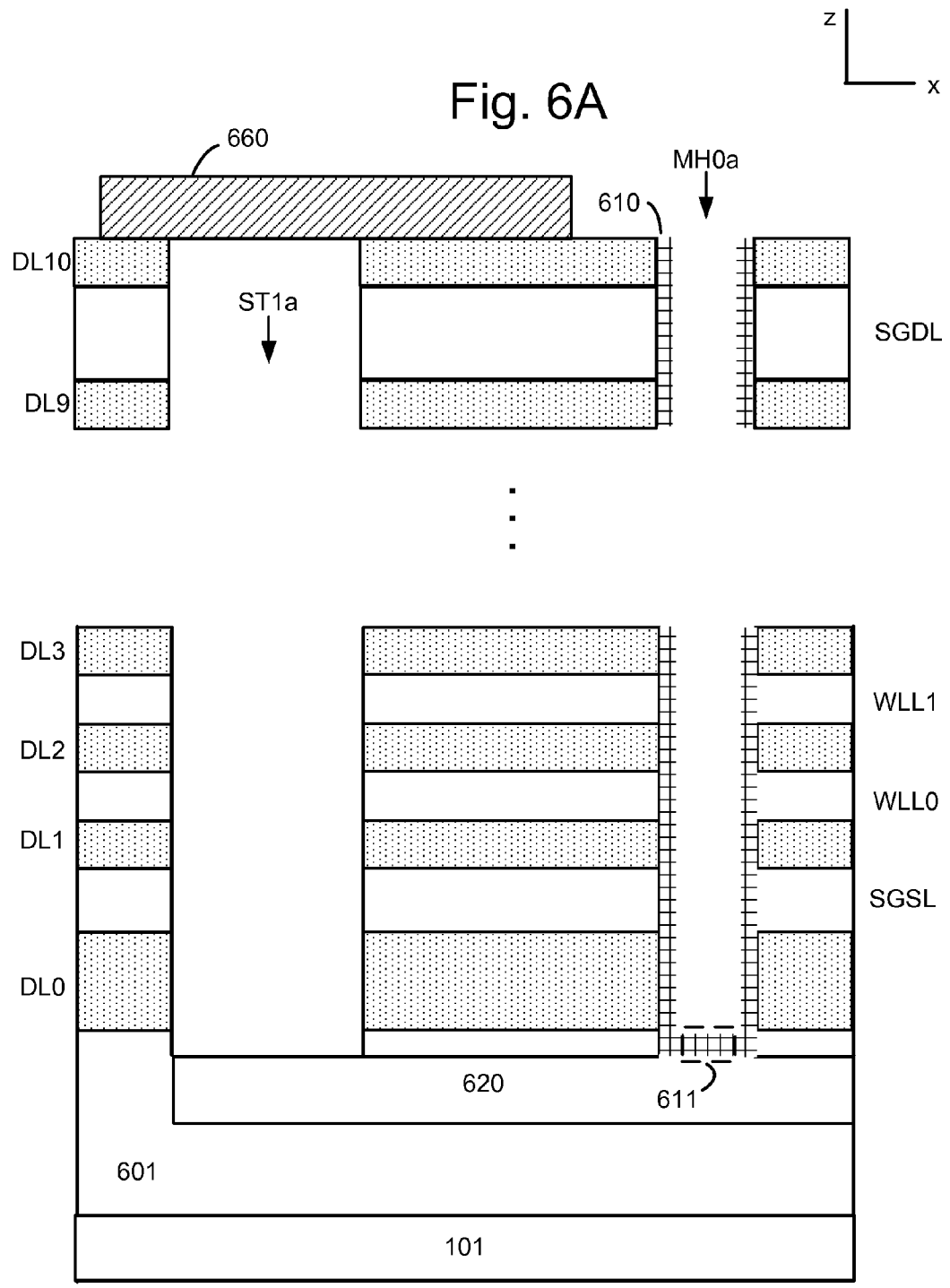

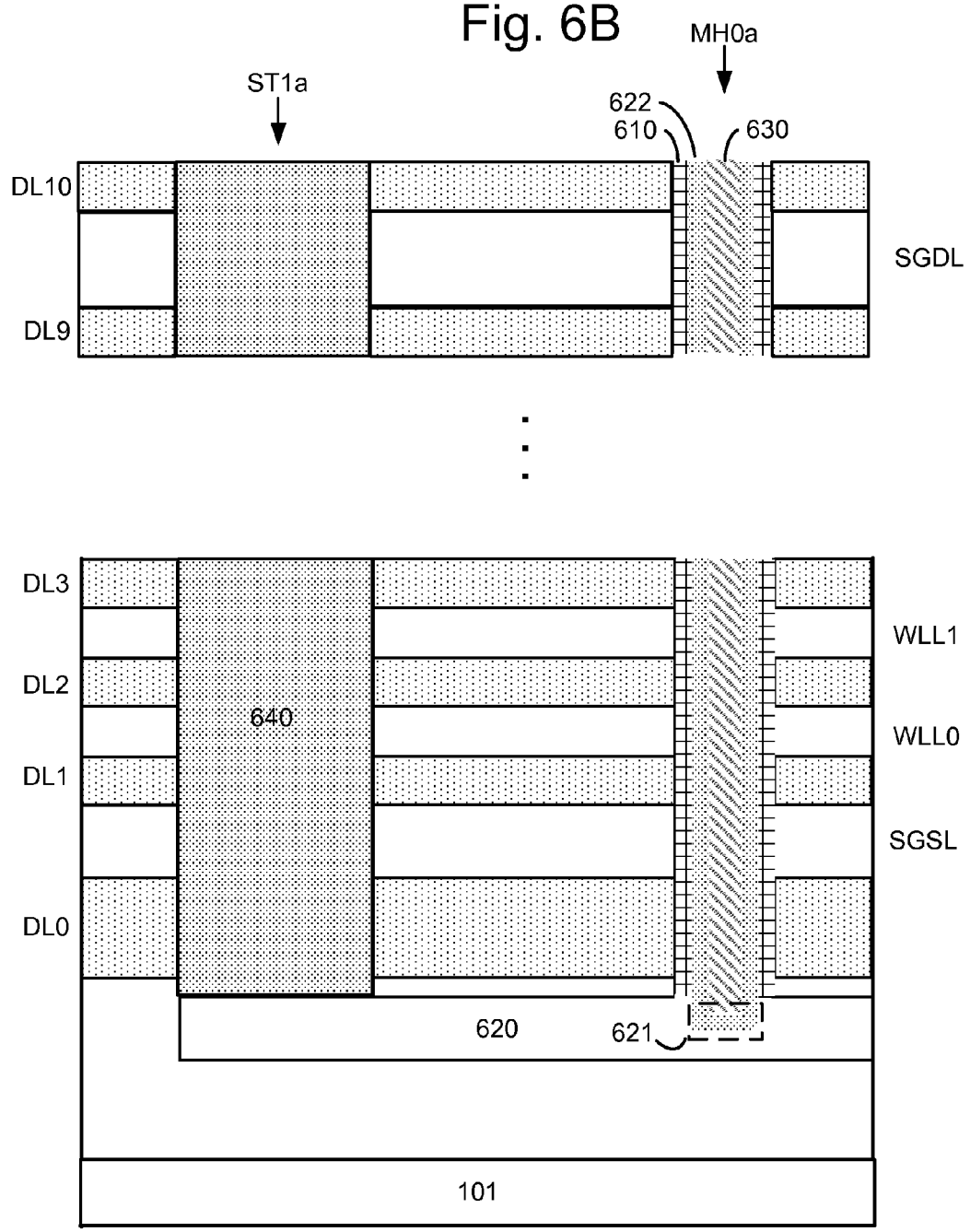

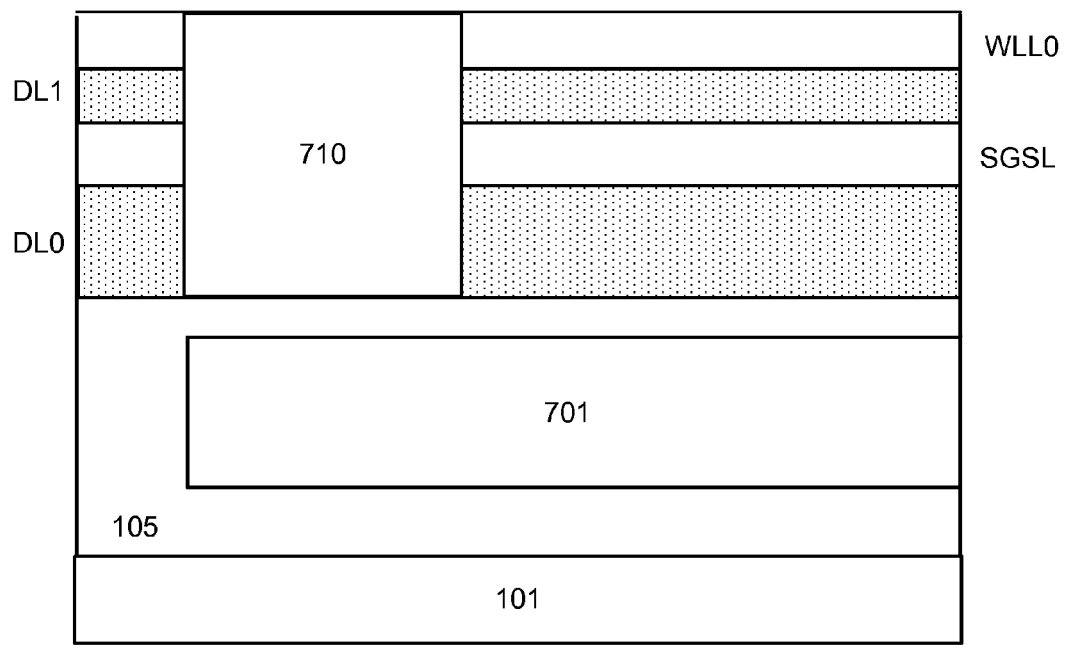
Fig. 7A1

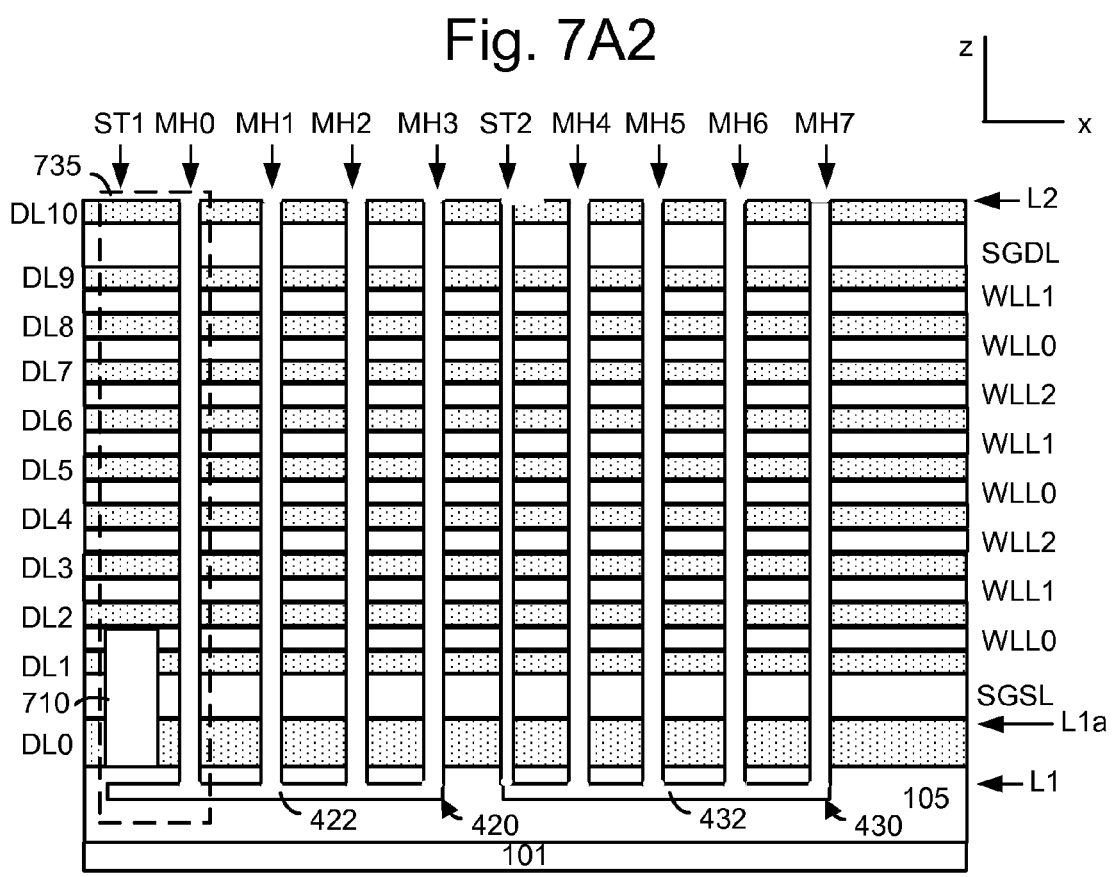

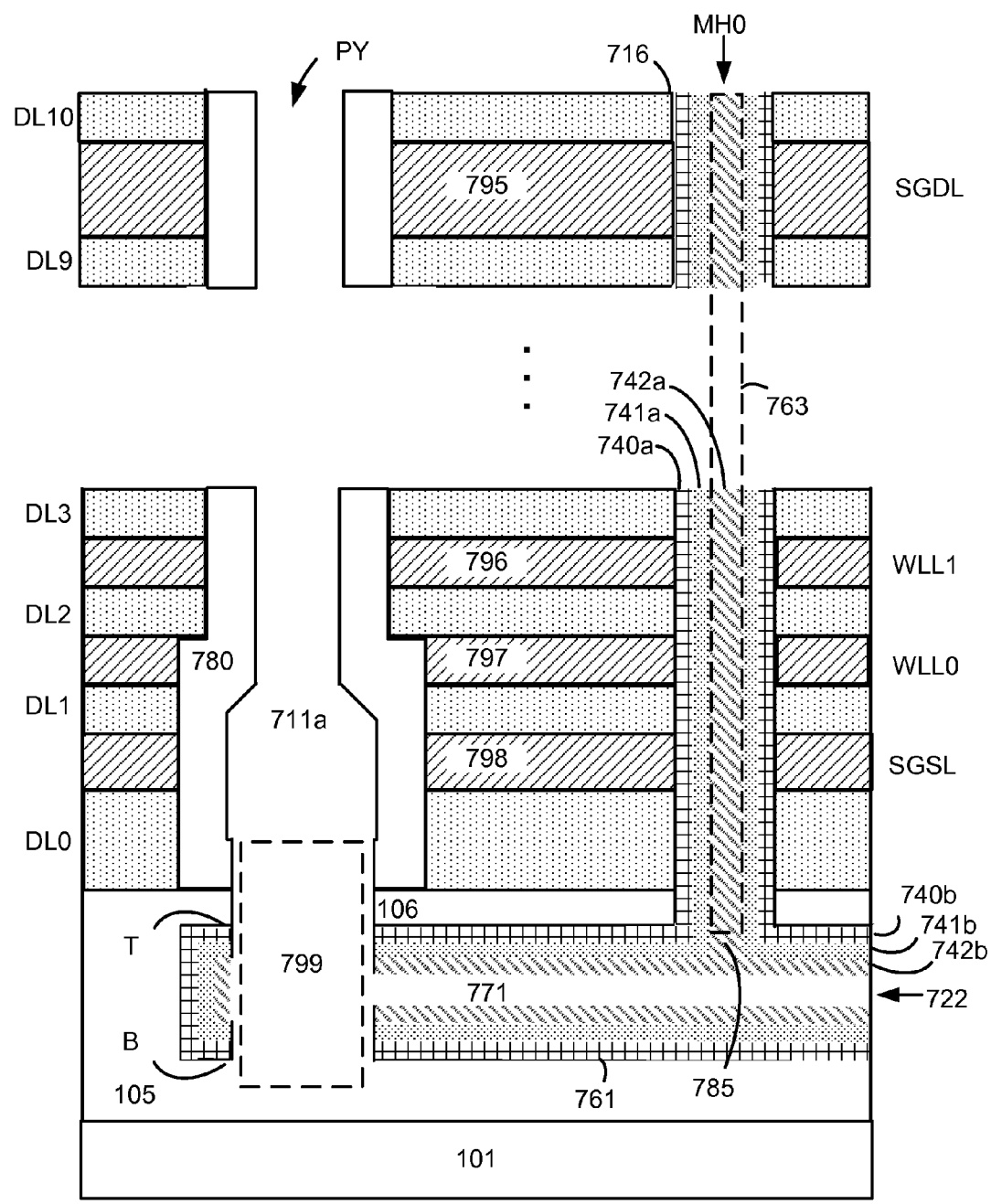

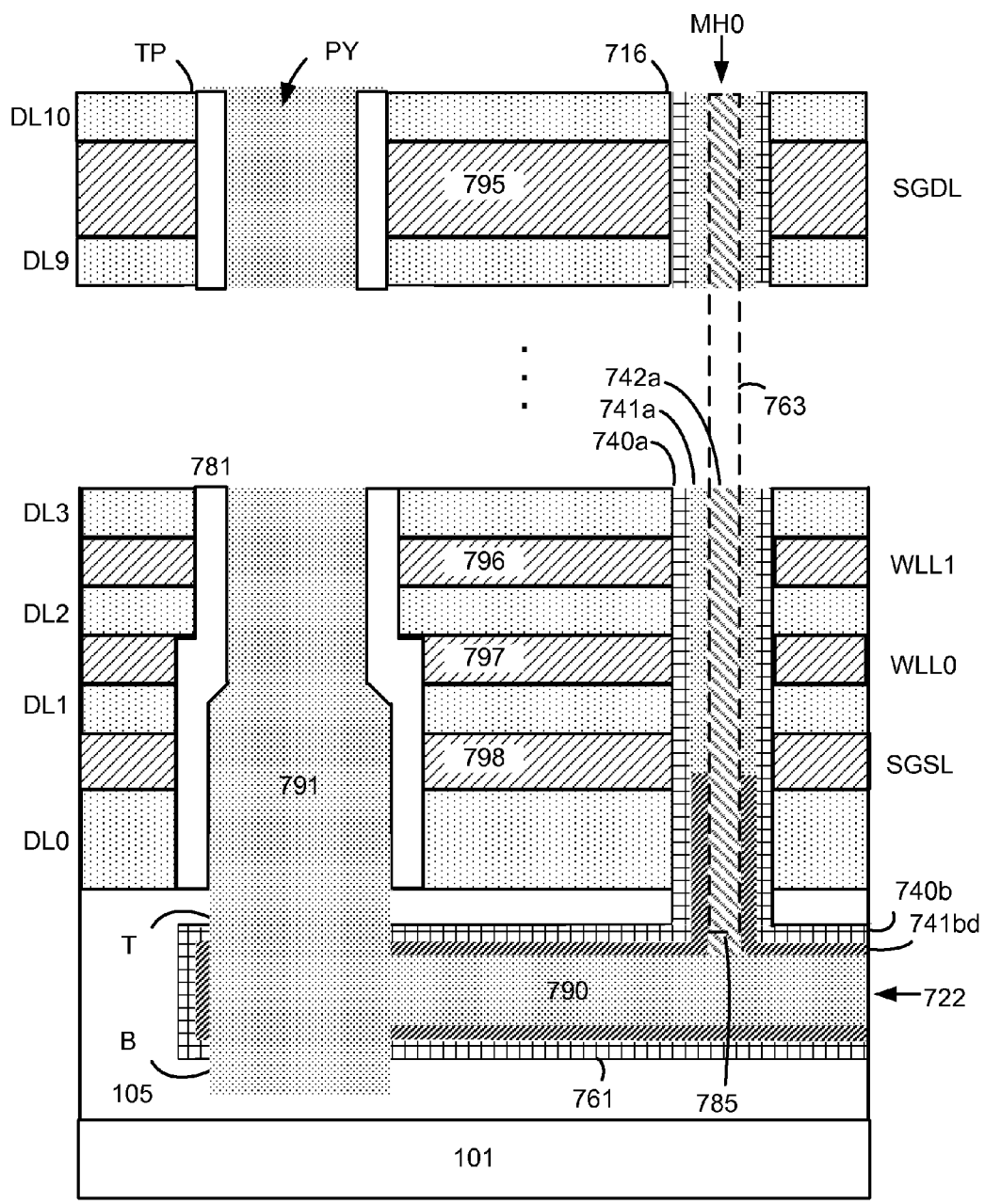

US 9,209,031 B2

METAL REPLACEMENT PROCESS FOR LOW RESISTANCE SOURCE CONTACTS IN 3D NAND

BACKGROUND

The present technology relates to techniques for fabricating a 3D non-volatile memory device.

Recently, ultra high density storage devices have been proposed using a 3D stacked memory structure. One example is referred to as a Bit Cost Scalable (BiCS) architecture. For example, a 3D NAND stacked memory device can be formed from an array of alternating conductive and dielectric layers. A memory hole is etched in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in fabricating such memory devices.

BRIEF DESCRIPTION OF THE DRAWINGS

Like-numbered elements refer to common components in the different figures.

FIG. 2A depicts an example set of NAND strings in the memory device of FIGS. 1A and 1B, where electrical contacts to source lines of the NAND strings are made via a slit structure.

FIG. 3B depicts an example implementation of the first option of the method of FIG. 3A.

FIG. 4C depicts a close up view of the region 435 of FIG. 4B.

FIG. 4E depicts the semiconductor device of FIG. 4D after steps 318 and 319 of FIG. 3B.

FIG. 4G depicts the semiconductor device of FIG. 4F after step 322 of FIG. 3B.

FIG. 4H depicts the semiconductor device of FIG. 4G after step 323 of FIG. 3B.

FIG. 4I depicts a cross-sectional view of the memory hole of FIG. 4H along the line 495.

FIG. 6A depicts an alternative semiconductor device in which a plurality of layers including a programmable film are formed at the bottom of a memory hole.

FIG. 6B depicts the alternative semiconductor device of FIG. 6A in which the layers are etched through to form an opening at the bottom of the memory hole.

FIG. 7A1 depicts a semiconductor device after step 353*b* of FIG. 3C.

FIG. 7A2 depicts the semiconductor device of FIG. 7A1 after step 354 of FIG. 3C.

FIG. 7H depicts the semiconductor device of FIG. 7G after step 364 of FIG. 3C.

FIG. 7K depicts the semiconductor device of FIG. 7J after step 322 of FIG. 3B.

DETAILED DESCRIPTION

Figure 1A:
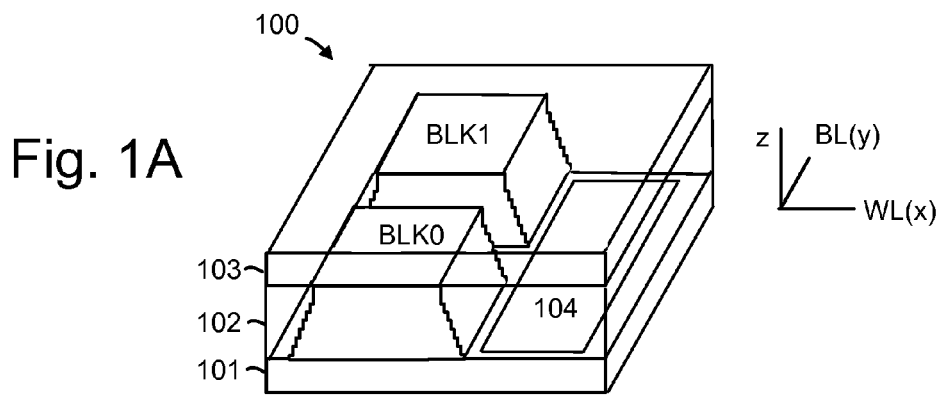
FIG. 1A is a perspective view of a 3D stacked non-volatile memory device.

Fabrication processes are provided for a 3D stacked non-volatile memory device which provide a source contact to memory holes. The source contact extends from the bottom of the memory holes to the top of a stack. A corresponding 3D stacked non-volatile memory device is also provided.

Typically, the stack includes alternating control gate layers and dielectric layers. Memory films are provided in memory holes in the stack. For example, a film stack of oxide-nitride-oxide and a channel layer of polysilicon can be deposited along the sidewall of each memory hole. In one approach, two adjacent memory holes are joined together at the bottom and form a U-shaped NAND string, e.g., in the case of P-BiCS. In another approach, each memory hole forms a straight NAND string. In this case, challenges are presented in forming a contact to the bottom of the memory hole. One solution is to etch an opening in the bottom of the memory hole after depositing the memory films. Subsequently a channel/body material is deposited along with a dielectric material filler. The channel material extends through the opening at the bottom of the memory hole to a channel region of a substrate. Additionally, a vertical contact extends from the top of the stack to the channel region. However, such etching is difficult due to the high aspect ratio of the memory hole and can cause damage to the memory films along the sidewalls. Moreover, the channel region of the substrate has a relatively high resistance.

Techniques provided herein avoid the need to etch through films at the bottom of a memory hole. Instead, a path is formed from the bottom of the memory hole to the top of the stack, and the memory films, channel material and dielectric material are deposited throughout the interior surfaces of the path and the one or more memory holes. The path can include a void in a substrate dielectric and a generally vertical passageway between the void and a top of the stack. Several memory holes can be joined to one passageway to allow concurrent deposition of the materials in the memory holes. Further, the dielectric material can be removed from the passageway and void, exposing the channel material and allowing the channel material to be doped to reduce its resistance. A heat treatment can be performed to cause the dopant to diffuse in the channel material upward in the memory holes. This configures the SGS transistor to generate gate-induced drain leakage (GIDL), such as for use in an erase operation.

Finally, a metal is deposited in the passageway and void to provide a continuous, low resistance conductive path in the passageway and void. The resistance is much lower than for a thin film transistor (TFT) connection, for example. This provides better device performance and the potential to connect more memory holes to the same slit. Moreover, compared to a U-shaped NAND string, there is no need for a back gate. Also, a reduction in string current which is caused by the increased length of the U-shaped NAND string is avoided.

The following discussion provides details of the construction of a memory device and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
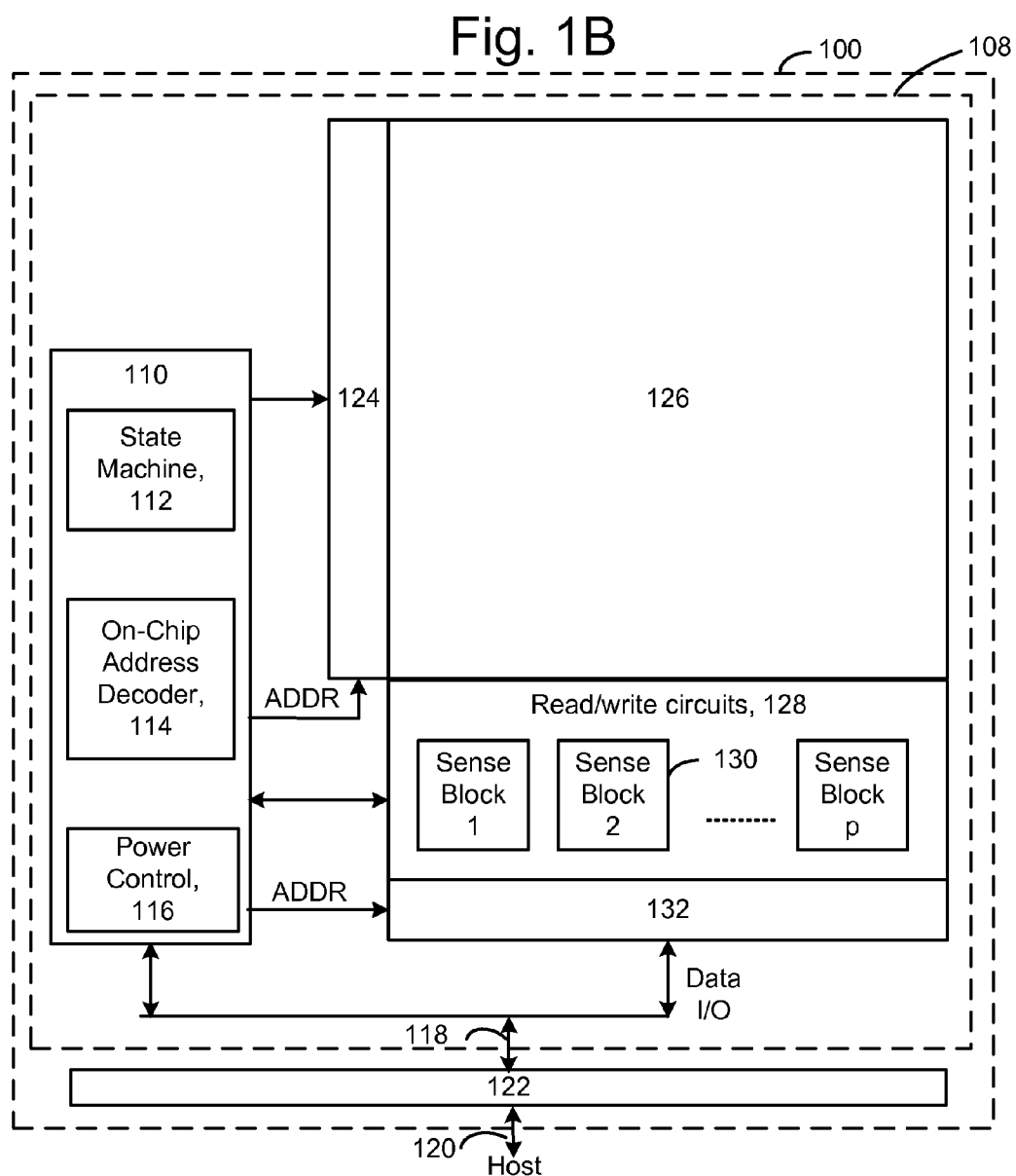
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a memory array 126 of memory cells, control circuitry 110, and read/write circuits 128. In a 3D configuration, the memory array can include the blocks BLK0 and BLK1 of FIG. 1A. In a 2D configuration, the memory array can include the block BLK0 of FIG. 5A. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word lines in a 2D configuration, word line layers (WLLs) in a 3D configuration, SGS and SGD transistors and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

Other types of non-volatile memory in addition to NAND flash memory can also be used.

FIG. 2A depicts an example set of NAND strings in the memory device of FIGS. 1A and 1B, where electrical contacts to source lines of the NAND strings are made via a slit structure. In this example, each NAND string is straight, includes a drain-side select gate (SGD) transistor at the top, a source-side select gate (SGS) transistor at the bottom, and a number of memory cells in between. A first group of NAND strings (Group0) includes NAND strings NS0A, NS0B, NS0C and NS0D which are connected at bottom portions to a source line SL0 and at top portions to a bit line BL0. Similarly, a second group of NAND strings are connected at bottom portions to a source line SL1 and at top portions to a bit line BL1, a third group of NAND strings are connected at bottom portions to a source line SL2 and at top portions to a bit line BL3, . . . , and a sixteenth group of NAND strings are connected at bottom portions to a source line SL15 and at top portions to a bit line BL15. The sixteenth group includes NAND strings NS0A-15, NS0B-15, NS0C-15 and NS0D-15. The number of NAND strings and their arrangement is an example only.

In this example, each source line is connected at one end to the slit structure (STa) which is an example of a passageway in the stack. The slit structure can be generally rectangular and extend crosswise to the source lines, in one approach. The slit structure extends in the x direction, orthogonal to the source lines, which extend in the y direction. The source lines extend like fingers of a comb.

Figure 2B:
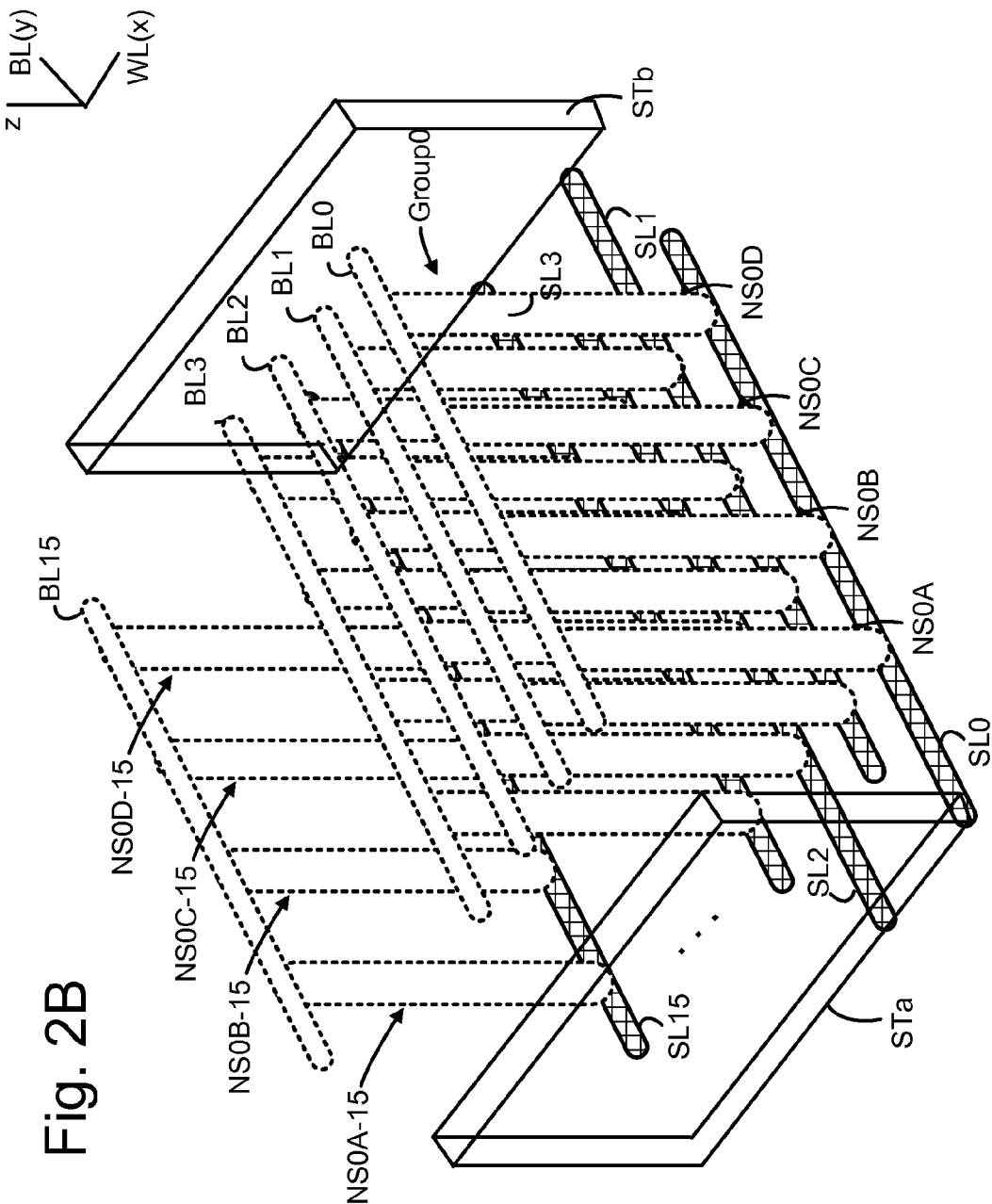
FIG. 2B depicts an example set of NAND strings in the memory device of FIGS. 1A and 1B, where electrical contacts to source lines of the NAND strings are made via opposing slit structures.

FIG. 2B depicts an example set of NAND strings in the memory device of FIGS. 1A and 1B, where electrical contacts to source lines of the NAND strings are made via opposing slit structures. The slits STa and STb are opposing slits, with a plurality of memory holes/NAND strings between them. Each slit is connected to a plurality of source lines which are formed by metal in voids in a substrate, as discussed further below. The metal in each void is connected to the bottom of a respective set of memory holes.

The NAND strings and their memory holes are arranged in groups such as Group0 and Group15. The source lines of a first group (e.g., SL0) are connected to one of the slit structures (e.g., STa), and the source lines of a second group (e.g., SL15) are connected to the other of the slit structures (e.g., STb). In this manner, the odd-numbered groups are connected to one slit structure and the even-numbered groups are connected to the other slit structure. This can facilitate the layout of the source contacts. Further efficiencies are achieved by connecting several NAND strings and their memory holes to one source line. The number of memory holes which are connected to one source line may be limited by factors such as the ability to etch and deposit films in an elongated horizontal void in a substrate. This example has four memory holes per source line.

Various other layouts may be used. For example, the source lines may extend diagonally to the slits. It is also possible for a memory hole to connect to more than one slit structure.

Figure 3A:
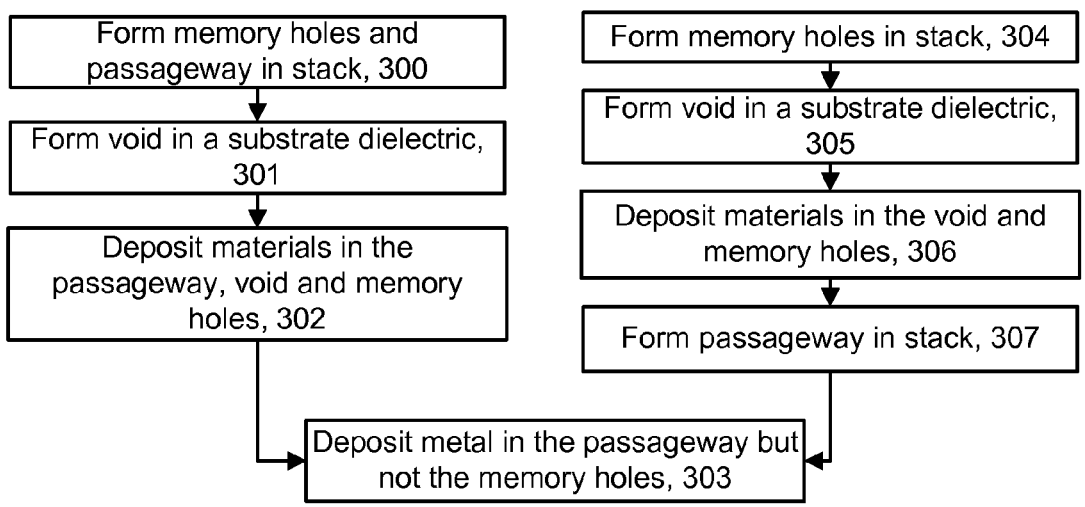
FIG. 3A depicts an overview of a method for fabricating a memory device with a low resistance source contact.

FIG. 3A depicts an overview of a method for fabricating a memory device with a low resistance source contact. A first option can be used in which a void is formed in a substrate dielectric, and the void is connected to the bottom of the memory holes and the bottom of the passageway before a plurality of materials are deposited. The substrate dielectric can be, e.g., a silicon substrate or a dielectric layer on a silicon substrate. It is possible to form the void in the silicon substrate, but it would be problematic to have the source line shorted to the substrate since during operation a bias can be applied to the source line. Providing the void in a dielectric layer insulates the void from the substrate.

An advantage of this approach is that the memory holes and passageway can be etched concurrently. In this option, step 300 includes forming memory holes and a passageway in a stack on a substrate. The memory holes and the passageway can be formed concurrently or separately. One or more memory holes and one or more passageways are formed. A passageway extends generally vertically in the stack, from a bottom of the stack to a top of the stack. A passageway could in theory alternatively extend at an oblique angle to the plane of the substrate. Step 301 includes forming a void in a substrate dielectric. This can involve introducing an etchant via the memory holes and passageway which removes a sacrificial material in the dielectric layer. Step 302 involves depositing materials in the passageway, void and memory holes. Generally, each material is deposited as a continuous film throughout the passageway, void and memory hole. Step 303 involves depositing metal in the passageway, but not in the memory holes.

In a second option, a void is formed in a substrate dielectric, and the void is connected to the bottom of the memory holes before a plurality of materials are deposited. The passageway is subsequently formed and connected to the void. An advantage of this approach is that the passageway can be used to provide a replacement material for the control gate layers before the passageway is connected to the void. Also, the deposition and removal of the dielectric material from the passageway is avoided, so that the amount of dielectric material and etchant is reduced. Doping of the channel material in the passageway is also avoided. In this option, step 304 involves forming memory holes in the stack. Step 305 involves forming a void in a substrate dielectric. This can involve introducing an etchant via the memory holes which removes a sacrificial material in the dielectric layer. Step 306 involves depositing materials in the void and memory holes, but not in the passageway, which has not yet been created.

Step 307 involves forming the passageway from the top of the stack to the void. Step 303 is then performed, as discussed.

FIG. 3B depicts an example implementation of the first option of the method of FIG. 3A. The process of FIG. 3B is discussed also in connection with FIG. 4B to 4I. Step 310 involves forming a trench in a substrate dielectric. The substrate can comprise silicon and the dielectric layer can comprise polysilicon, for example. One reason to provide the trench in a dielectric layer is that the substrate may receive a voltage which would interfere with the source contact. The trench is formed in a desired pattern in which horizontal portions of the source contact will be located. The trench may include portions which are relatively wide or relatively deep. Example patterns are depicted in FIGS. 2A, 2B and 5A to 5C. A trench is meant to include, e.g., a region of the substrate which is removed in specified pattern, where the region is filled with a sacrificial material, and the sacrificial material is subsequently removed, forming a void. Step 311 involves depositing a sacrificial material in the trench. The sacrificial material can be any material which can be selectively etched compared to the stack materials. For example, this can be a nitride such as silicon nitride (Si3N4), amorphous silicon, or polysilicon. Step 311a involves covering the trench with additional dielectric material. The additional dielectric material insulates the voids from the stack but is not required.

Step 312 involves forming a stack of alternating control gate layers and dielectric layers over the trench, e.g., on the substrate dielectric. The stack can be on the additional dielectric material (106, FIG. 7H) which covers the trench. See FIG. 4A. Or, the stack may be formed directly on the sacrificial material in the trench. The stack covers the trench and the sacrificial material. The dielectric layers in the stack may comprise oxide and/or nitride, for instance. In one approach, the stack is initially formed with the final material for the control gate layers. In another approach, the stack as initially formed includes a sacrificial material which is replaced by a replacement material to provide the final material. For example, a sacrificial material of the control gate layers can be replaced with metal.

Step 313 involves etching memory holes and a passageway in the stack, down to the sacrificial material in the void, thereby exposing portions of the sacrificial material in the void. A slit is an example of a passageway in the stack. One or more passageways are formed. A mask such as photoresist or a hard mask can be applied to the top of the stack, where openings in the mask define the etch pattern. For example, a dry etch can be used. The etching depth can be controlled so that it stops when the sacrificial material is reached. Generally, the passageway and memory holes can be etched at the same time or separately. The memory holes are typically circular in cross-section, but other shapes are possible as well. Moreover, the passageway can be generally rectangular, although other shapes are possible as well.

The mask can then be removed. Step 314 involves removing the sacrificial material in the substrate dielectric via the memory holes and/or the passageway, thereby creating a void in the trench. For example, the sacrificial material can be etched away using an isotropic (non-directional) etch. An etchant can be supplied to the sacrificial material via the passageway and/or memory holes. The void and the passageway together form a path from the bottom of the memory holes to the top of the stack.

Step 315 involves depositing a plurality of materials in the passageway, void and memory holes. The materials can be deposited as films one material at a time in a prescribed sequence. For each material, this can involve, e.g., supplying the material at the top of the passageway and/or memory holes. Generally, the deposition of the materials as described herein can involve chemical vapor deposition (CVD) and/or atomic layer deposition (ALD).

The deposited material coats the inner surfaces or walls of the passageway, void and memory holes, forming a film. Generally, each film coats an inner surface of the passageway, void and the memory hole, to form a continuous annular film which extends from a top of the memory hole to the bottom of the memory hole, laterally through the void, and vertically through the passageway, to the top of the stack. For example, the first deposited film is in contact with the inner surfaces, the second deposited film is in contact with the first deposited film, and so forth.

In an example implementation, the plurality of materials include a block oxide, followed by a nitride (e.g., Si3N4), followed by a tunnel oxide, in an oxide-nitride-oxide (O—N—O) configuration. The block oxide and tunnel oxide can include, e.g., silicon oxide, silicon nitride, silicon oxynitride, or other high-k insulating materials. The block oxide and tunnel oxide can be the same material or different materials. Nitride is an example of a programmable film which can be altered to store data. For example, nitride is an example of a charge storage material or charge trapping material which can store no charge, or a specified amount of charge, which corresponds to a data state.

In one example, in the final configuration of the stack, the control gate layers are metal and a channel layer is polysilicon, so that memory cells in a metal-oxide-nitride-oxide-silicon (MONOS) configuration are provided. In another example, the control gate layers are doped polysilicon and the channel layer is polysilicon, so that memory cells in a silicon-oxide-nitride-oxide-silicon (SONOS) configuration are provided. Other configurations are possible as well.

Step 316 involves depositing a channel material in the passageway, void and the memory holes. For example, this can involve supplying polysilicon at the top of the passageway and memory holes. The polysilicon film can form a channel in the memory holes which provides a current path in a NAND string. Generally, the channel material which is proximate to the memory cells in the memory holes is undoped. Portions of the channel material above the SGD transistor and below the SGS transistor can be doped. The channel material in a memory holes is also referred to as the body of a NAND string.

Step 317 involves depositing a dielectric material (e.g., silicon oxide, SiO2) in the passageway, void and the memory holes. Due to the larger minimum cross-sectional dimension of the passageway and void compared to the memory holes, an air gap remains in the passageway and void after this deposition. That is, the passageway and void are not completely filled by the dielectric material. The minimum cross-sectional dimension of the passageway and void is larger than the minimum cross-sectional dimension of the memory holes by some specified amount such as by at least 10-30%. The amount depends on the specifics of the geometry as well as the deposition process used. On the other hand, core regions of the memory holes may be completely filled by the dielectric material.

Step 318 involves covering the memory holes with a mask at the top of the stack. The mask has openings for the passageways. Step 319 involves removing the dielectric material from the passageway and void (but not from the memory holes) via the passageway, thereby exposing the channel material in the passageway and void. For example, this removal can involve a wet etch or a vapor etch. A wet etch involves supplying a liquid phase etchant at the top of the passageway. A vapor etch involves supplying a vapor phase etchant at the top of the passageway. This can be an isotropic etch which selectively removes the dielectric material.

Optionally, the passageway and void may become partly or fully filled by the dielectric material depending on their minimum cross-sectional dimension. In this case, removal of the dielectric material from the passageway and void is still possible but would be more difficult.

Step 320 involves doping the channel material in the passageway and void, via the passageway. For example, this can involve gas phase doping in which a dopant is supplied at the top of the passageway. In one approach, a dopant at a concentration of 10^20 to 10^21 cm-3 or more can be used. An n-type dopant such as Arsenic can be used, for instance. A high doping concentration is desirable to reduce the resistance of the channel material in the passageway and void.

At step 320a, there is an option to deposit additional doped polysilicon on the doped channel material, which itself may be doped polysilicon. This results in a thicker layer of doped polysilicon in the void. Specifically, if the remaining doped channel material in the void is very thin, it may be favorable to deposit additional polysilicon to make good contact to the channel. The additional polysilicon may be more heavily doped than the doped channel material. The additional polysilicon may be introduced via the passageway, and may or may not subsequently be removed from the passageway. This step thus involves introducing additional doped material to the void via the passageway, after the doping the portion of the channel material which is in the void.

Step 321 involves performing a heat treatment, e.g., anneal, for the memory device to cause the dopant to diffuse upward in the channel material in the memory holes, starting from a bottom of the memory holes. This involves applying heat after the doping, where the heat causes the dopant to diffuse upwards in a portion of the channel material which is in the memory hole. See FIG. 4H. The anneal time and temperature will determine the upward distance of the diffusion in the channel material. As a rough example, a temperature of 1000 degree C. for 10 seconds can be used. The anneal conditions depend on the specifics of the geometry, dimensions, and materials. The upward diffusion of the dopant can be helpful is allowing the SGS transistors to generate gate-induced drain leakage (GIDL). In particular, a doped region of the channel material can provide a drain region of the SGS transistor. When a voltage applied to this drain region via the source contact is sufficiently higher than the control gate voltage, GIDL causes holes to flow from the drain region of the SGS transistor into the channel layer to charge up the channel layer, such as in an erase operation. Generally, the heating time and duration, or thermal budget, can be controlled to cause the dopant to diffuse upward in the channel material to a bottom control gate layer (e.g., the SGS layer) of the control gate layers. The diffusion can be approximately even with the bottom of the bottom control gate layer, for instance (see level L1a in FIG. 4F).

The additional ability to generate GIDL at the SGS transistor is advantageous since the SGD transistor can be optimized for minimum leakage rather than being used to generate GIDL.

Note that the order of the steps as shown is not necessarily required. For example, the heat treatment can be performed after the metal is deposited.

Step 322 deposits a metal in the passageway and void, via the passageway, to form a conductive path from the bottom of each memory hole through the void to a top of the passageway. For example, Tungsten is a suitable metal. An adhesion layer such as titanium nitride (TiN) may be deposited before the metal to help adhere the metal to the doped polysilicon channel material. The metal and the doped channel material form a continuous conductive path from a bottom of the memory holes to a top of the passageway.

Step 323 performs additional processing to provide a source contact from the top of the metal in the slit to an upper metal layer. In one approach, the materials in the memory hole are etched back slightly to a desired distance from the top surface of the top control gate layer, e.g., the SGDL layer (FIG. 4H). A cap material is deposited in the recessed are at the top of the memory hole. A contact material can then be formed on the cap material by appropriate patterning of the contact material.

Figure 3C:
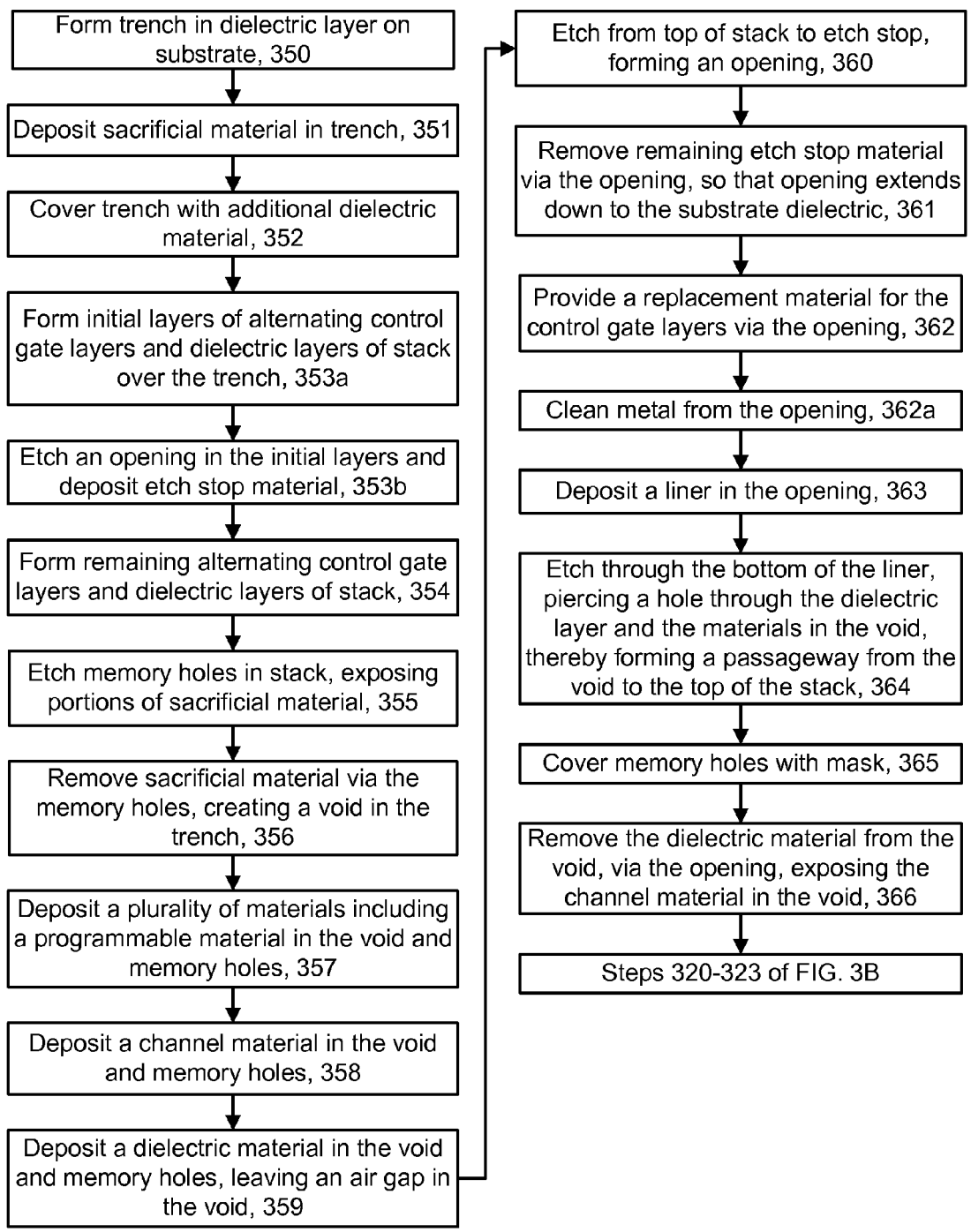
FIG. 3C depicts an example implementation of the second option of the method of FIG. 3A.

FIG. 3C depicts an example implementation of the second option of the method of FIG. 3A. The process of FIG. 3C is discussed also in connection with FIG. 7A1 to 7K. Some of the steps are similar to those in FIG. 3B. Step 350 involves forming a trench in a substrate dielectric. Step 351 involves depositing a sacrificial material in the trench. Step 352 involves covering the trench with additional dielectric material. Step 353a involves forming initial layers of alternating control gate layers and dielectric layers of the stack over the trench, on the substrate dielectric. Step 353b involves etching an opening in the initial layers and depositing an etch stop material (e.g., polysilicon). An overfill of the etch stop material may be removed by chemical-mechanical polishing (CMP) or a dry etch, for example. Step 354 involves forming remaining alternating control gate layer and dielectric layers of the stack over the initial layers. The etch stop material is thus provided on the substrate dielectric within the stack. Step 355 involves etching memory holes in the stack, thereby exposing portions of the sacrificial material in the substrate dielectric. For example, a dry etch can be used.

The mask can then be removed. Step 356 involves removing the sacrificial material in the trench via the memory holes, thereby creating a void in the trench. An etchant which is selective of the sacrificial material can be provided via the memory holes. Step 357 involves depositing a plurality of materials in the void and memory holes. The materials are supplied at the top of the memory holes. Step 358 involves depositing a channel material in the void and the memory holes. For example, this can involve supplying polysilicon at the top of the memory holes. Step 359 involves depositing a dielectric material in the void and the memory holes, via the memory holes, leaving an air gap in the void. Step 360 involves etching from the top of the stack to the etch stop material, thereby forming an opening in the stack from the top of the stack to the top of the etch stop material. A portion of the etch stop material may be consumed, leaving a remainder of the etch stop material.

Step 361 involves removing the remainder of the etch stop material via the opening, so that the opening extends down to the substrate dielectric. In one approach, this etching step does not pierce the materials in the void. Step 362 involves providing a replacement material for the control gate layers via the opening. For example, the sacrificial material of the control gate layers can be removed by etching, creating voids between the dielectric layers of the stack, followed by introducing a metal (e.g., W) into the voids via the opening. At step 362a, metal which remains in the opening is removed by cleaning to avoid shorting the control gate layers. Step 363 involves depositing a liner (e.g., SiO2) in the opening which is thicker than a final target value. This isolates the stack layers from the metal which will be provided in the opening. Step 364 involves etching through the bottom of the liner, through part of the substrate dielectric and reaching the void, thereby piercing a hole through the materials in the void (e.g., the programmable material, channel material and dielectric material) and forming a passageway from the void to the top of the stack. The etching can pierce the top of the void only, or both the top and bottom of the void. Step 365 includes covering the memory holes with a mask. Step 366 involves removing the dielectric material from the void, via the opening, thereby exposing the channel material in the void. For example, an etchant can be introduced to the void from the top of the passageway. Steps 320-323 of FIG. 3B are then performed.

Figure 4A:
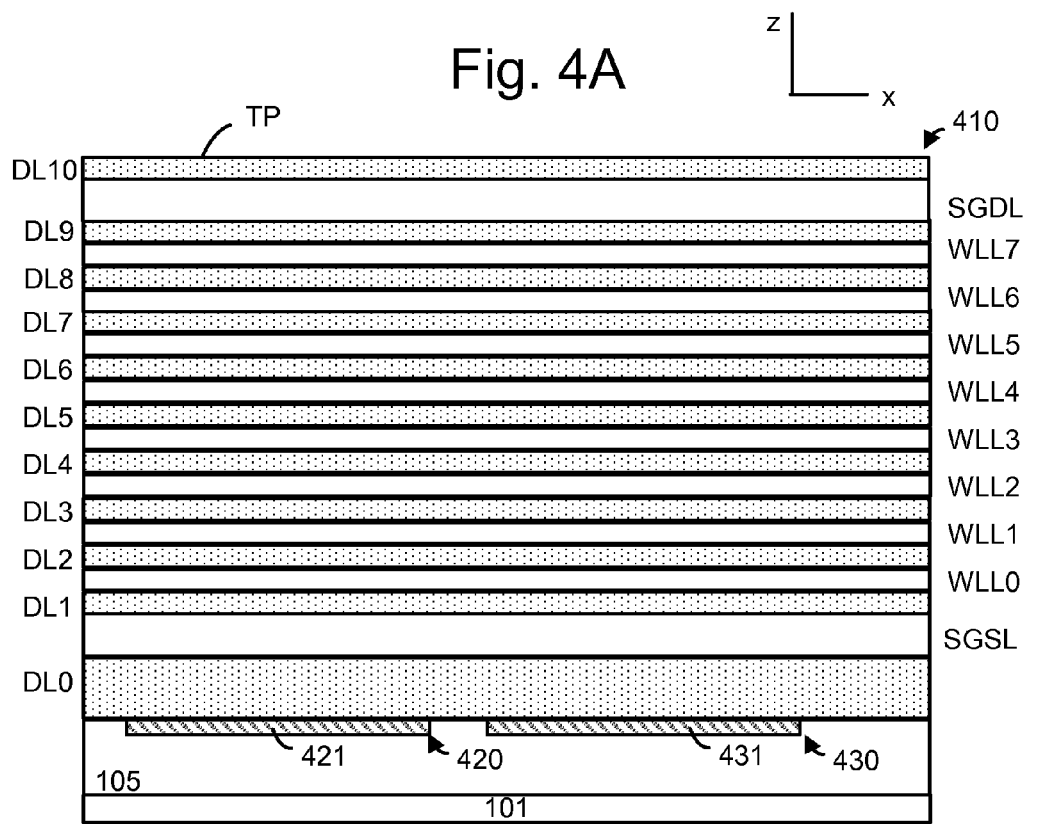
FIG. 4A depicts a cross-sectional view of a semiconductor device including a stack formed on a substrate, consistent with step 312 of FIG. 3B.

FIG. 4A depicts a cross-sectional view of a semiconductor device including a stack 410 formed on a dielectric layer 105 on a substrate 101, consistent with step 312 of FIG. 3B. The substrate comprises trenches such as a trench 420 filled with a sacrificial material 421, and a trench 430 filled with a sacrificial material 431. The stack 410 is fabricated on the dielectric layer 105 on the substrate. The stack includes alternating control gate layers and dielectric layers. The control gate layers can include word line layers (e.g., WLL0-WLL7) which are used to provide control gate voltages for memory cells in the final memory device. Moreover, typically, a top control gate layer (e.g., SGDL) of the control gate layers is a control gate of a drain-side select gate transistor, and a bottom control gate layer (e.g., SGSL) of the control gate layers is a control gate of a source-side select gate transistor. Dielectric layers DL0-DL10 are also depicted. The number of layers shown is an example only. The stack can be fabricated by depositing each layer in turn upon the previous layer.

In one possible implementation, the control gate layers comprise polysilicon which is doped during deposition, and these layers remain in the final memory device. Optionally, the control gate layers are treated to convert them to metal silicide. In another possible implementation, a sacrificial material is initially provided in the control gate layers and this material is replaced with a highly conductive material such as metal in the final memory device.

Figure 4B:
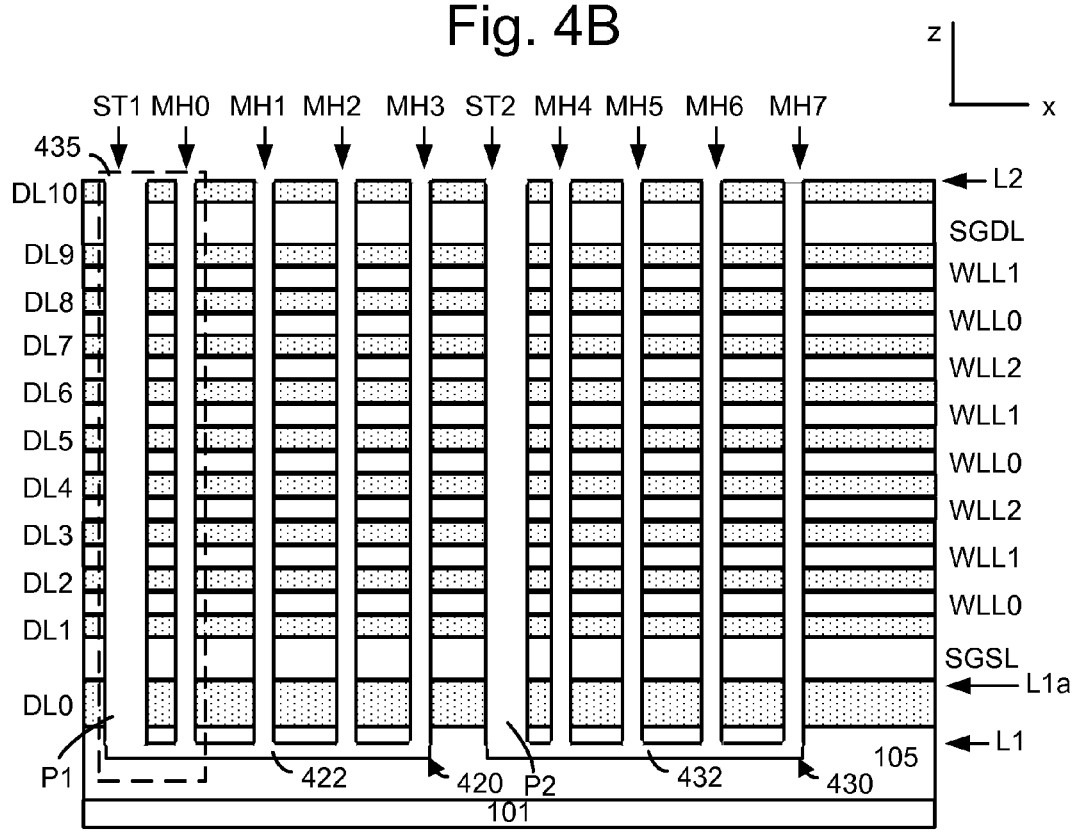
FIG. 4B depicts the semiconductor device of FIG. 4A after steps 313 and 314 of FIG. 3B.

FIG. 4B depicts the semiconductor device of FIG. 4A after steps 313 and 314 of FIG. 3B. Memory holes MH0-MH7 and slits ST1 and ST2 (e.g., passageways) are etched vertically through the stack, from a top (TP) of the stack at the level L2, to the sacrificial material at the bottom of the stack, denoted by level L1. After the sacrificial material is removed, the voids 422 and 432 are created. The slit ST1 and the void 422 form a path P1, and the slit ST2 and the void 432 form a path P2. A region 435 is depicted in further detail in FIG. 4C. A level L1a is at the bottom of the SGSL layer.

Optionally, more than one SGS or SGD layer is provided in a stack. For example, two SGD layers may be provided, separated by a dielectric layer. That is, multiple control gate layers can be used to form a select device. In a further option, a layer comprises multiple sublayers of different materials.

The memory hole and slits are shown as having a uniform cross-section through the height of the stack, in the z direction, for simplicity. In practice, the cross-section can vary due to the etching process. In one approach, the cross-section is tapered, becoming narrower at the bottom of the stack.

FIG. 4C depicts a close up view of the region 435 of FIG. 4B. Dashed lines represent the area of the slit ST1, the memory hole MH0 and the void 422, which have respective cross-sectional dimensions of Aslit, Amh and Avoid. The slit and void together form the path P1. The dimensions Aslit and Avoid are greater than Amh. Aslit is shown as being greater than Avoid, but this is an example only.

The slit and memory hole are generally vertically extending while the void is generally horizontally extending. A portion of the substrate 101 is also depicted.

Figure 4D:
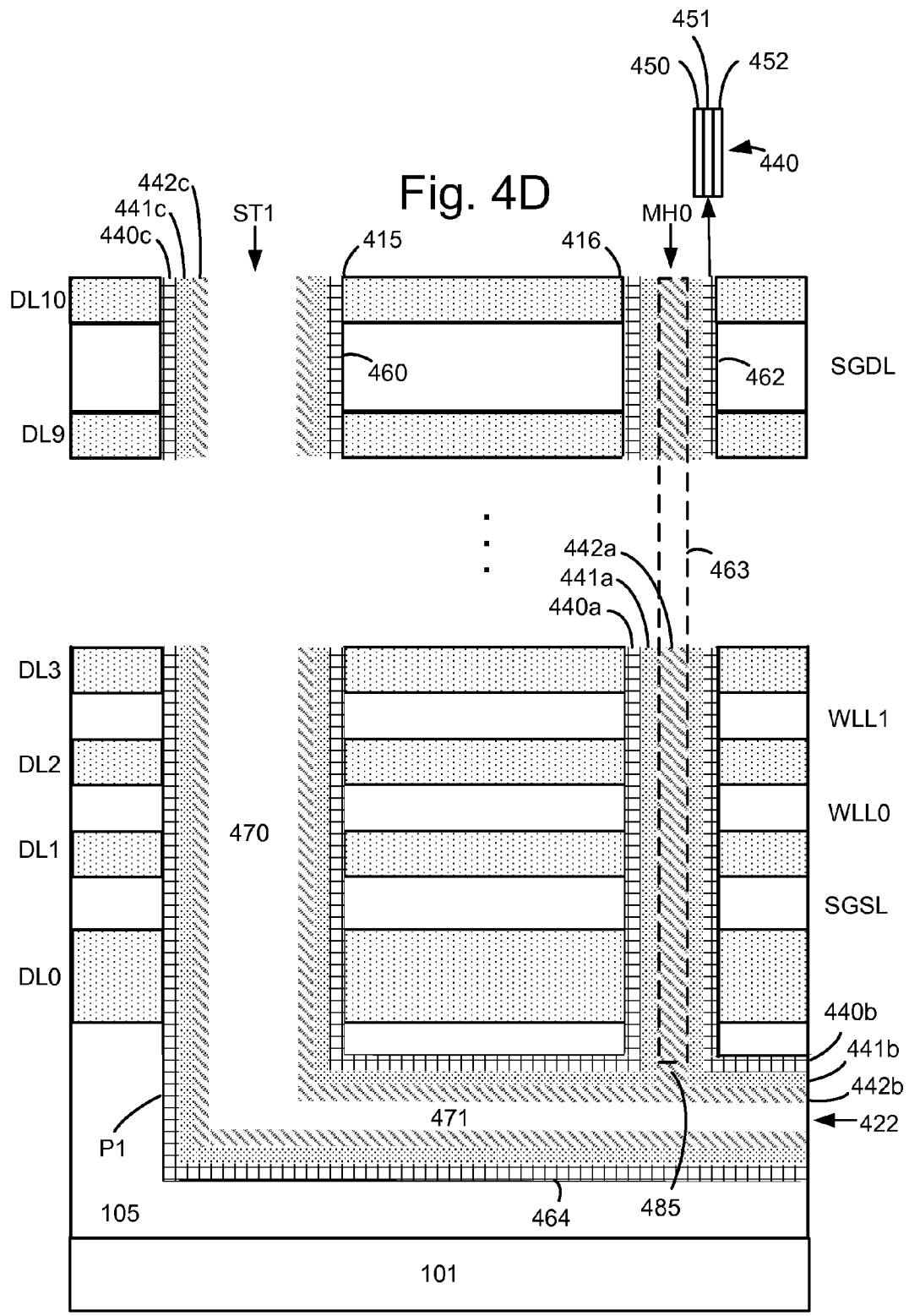
FIG. 4D depicts the semiconductor device of FIG. 4C after steps 315-317 of FIG. 3B.

FIG. 4D depicts the semiconductor device of FIG. 4C after steps 315-317 of FIG. 3B. In this example, the plurality of materials include an oxide-nitride-oxide (ONO) set of films 440 comprising a block oxide 452, a charge trapping film 451 (a programmable film) and a tunnel oxide 450. The plurality of materials also include a channel material such as polysilicon, and a dielectric material such as oxide. Portions 440a, 440b and 440c of the ONO films are in the memory hole, void and slit, respectively. Portions 441a, 441b and 441c of the channel material are in the memory hole, void and slit, respectively. Portions 442a, 442b and 442c of the dielectric material are in the memory hole, void and slit, respectively. The materials coat the inner surfaces of the passageway and memory holes, including a wall or inner surface 460 of the slit, a wall or inner surface 464 of the void and a wall or inner surface 462 of the memory hole. Since the cross-sectional dimension of the slit and void is greater than that of the memory hole, the memory hole becomes filled by the dielectric material while an air gap remains in the slit and void. For example, the slit has a gap 470 and the void has a gap 471. A dashed line 463 represents the portion of the dielectric material that fills the memory hole MH0.

Each film coats an inner surface of the passageway and the memory hole, to form a continuous annular film which extends from a top 416 of the memory hole to the bottom 485 of the memory hole and through the passageway P1 back to the top of the slit 415 or passageway P1.

FIG. 4E depicts the semiconductor device of FIG. 4D after steps 318 and 319 of FIG. 3B. A mask M such as photoresist at the top of the stack covers the memory hole and has an opening for the slit ST1. An etchant is supplied to the passageway via the top of the slit to remove the dielectric material in the passageway. The dielectric material 442a remains in the memory hole. The mask prevents the etchant from entering the memory hole.

Figure 4F:
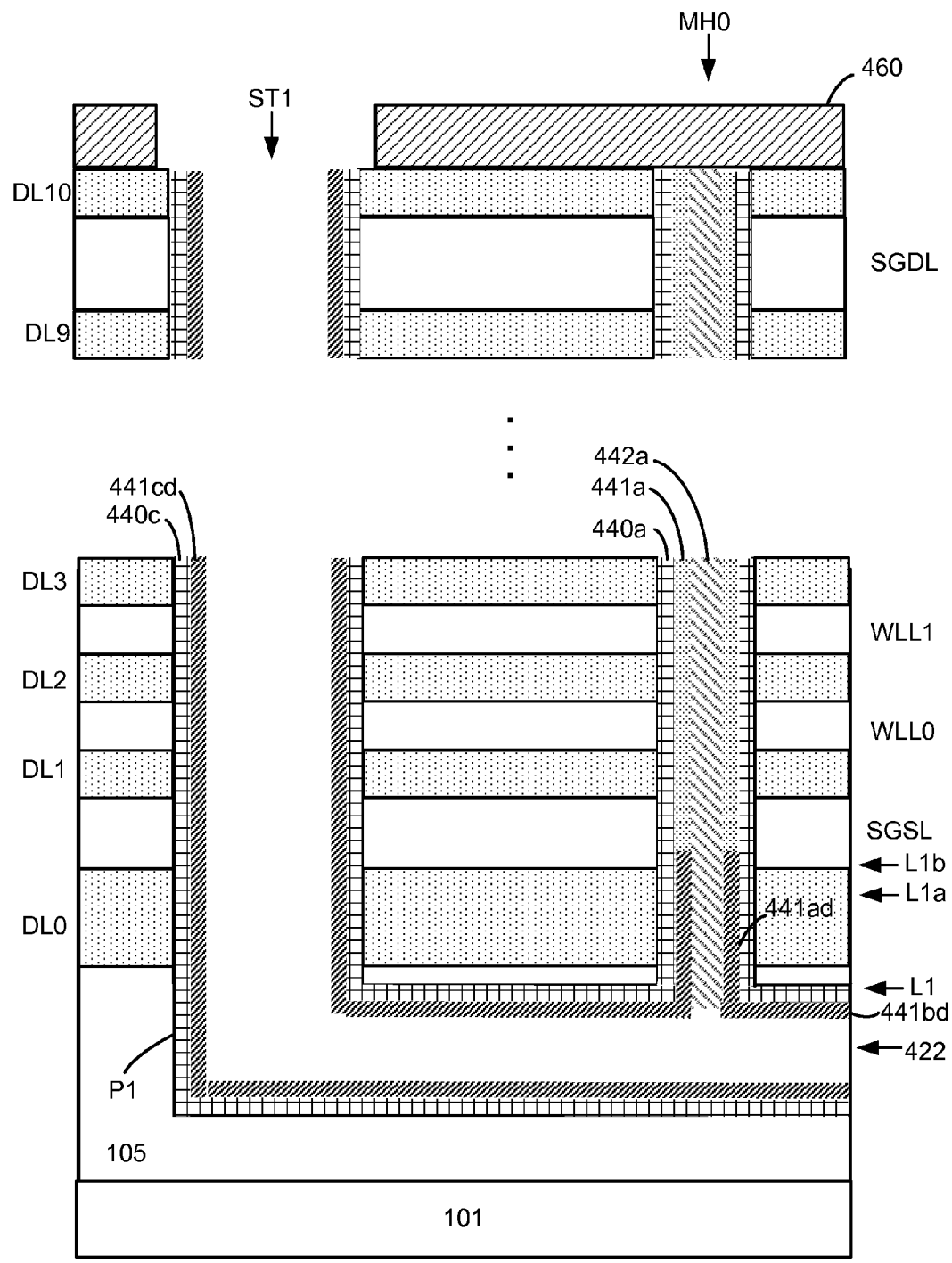
FIG. 4F depicts the semiconductor device of FIG. 4E after steps 320 and 321 of FIG. 3B.

FIG. 4F depicts the semiconductor device of FIG. 4E after steps 320 and 321 of FIG. 3B. The channel material is doped to provide a doped channel material 441bd and 441cd. A heat treatment cause a portion 441ad of the channel material in the memory hole to be doped as well, between roughly a level L1, at the bottom of the memory hole or stack and up to a level L1a at the bottom of the SGSL layer or higher, such as to a level L1b. The mask prevents the dopant from entering the top of the memory hole.

FIG. 4G depicts the semiconductor device of FIG. 4F after step 322 of FIG. 3B. A metal such as tungsten is added which fills the passageway P1. One portion 480 of the metal is in the slit and another portion 481 is in the void 422. The mask prevents the metal from entering the memory hole. The metal in the void extends to a bottom of each memory hole of a plurality of memory holes, such as the bottom 485 of MH0. Generally, the metal can be provided concurrently in a plurality of voids in the substrate dielectric, such as metal portions 481 and 482 in FIG. 5A. The metal in each void connects to the portion 480 of the metal in a slit and to a bottom 485 of each memory hole of a group of memory holes. A metal conductive path is formed from the bottom of each memory hole to the top (TP) of the stack.

FIG. 4H depicts the semiconductor device of FIG. 4G after step 323 of FIG. 3B. Additional processing can include connecting the top of the slit structure to a source line voltage and connecting the top of the memory hole to a bit line voltage. The materials in the memory hole may be etched back slightly to make room to deposit a cap material 494. Subsequently, contact structures 461 and 492 can be provided above the slit and memory hole which extend upward to a metal layer. A NAND string 499 is formed in the memory hole. The NAND string includes a SGD transistor 490, example memory cells 491 and 492 and an SGS transistor 493.

FIG. 4I depicts a cross-sectional view of the memory hole of FIG. 4H along the line 495. Each of the memory holes is filled with a plurality of annular layers or films, and a core region of each of the memory holes is filled with a core filler material. In one approach, the annular layers are annular cylinders. The layers include a block oxide 452, a charge trapping film 451, a tunnel oxide 450 and the portion 441a of the channel material. The dielectric material 442a is also depicted. In this example, the charge trapping film is between the block oxide and the tunnel oxide.

Figure 5A:
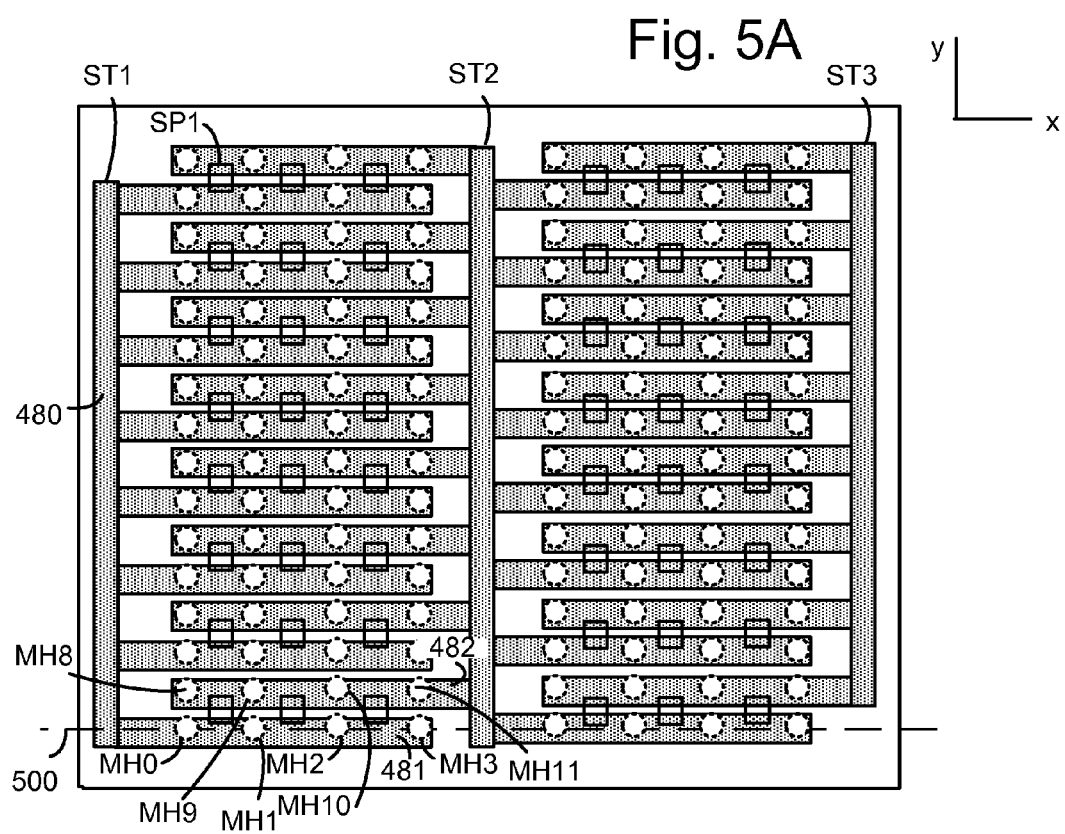
FIG. 5A depicts a cross-sectional view along the level L1 of the memory device of FIG. 4B, showing a first example pattern formed by a source contact material in passageways and voids.

FIG. 5A depicts a cross-sectional view along the level L1 of the memory device of FIG. 4B, showing a first example pattern formed by a source contact material in passageways and voids. The source contact includes the portion 480 in the slit ST1 and the portion 481 in the void 422. Additional portions of the source contacts which are in additional voids in the substrate dielectric, such as a portion 482 are also depicted. In this example, the slit ST2 is connected to a metal portion on both sides of the slit. Various other approaches are possible. Note that the cross-sectional view of FIG. 4B is coincident with the line 500.

In this example, the metal is provided in opposing slits (e.g., ST1 and ST2) in the stack. A plurality of memory holes (e.g., MH0) are arranged between the opposing slits. The metal in each slit connects to metal (e.g., metal portions 481, 482) in a respective void in the substrate dielectric. The metal in the voids in the substrate dielectric comprise spaced apart parallel regions which extend, at one end, from a bottom of a respective slit. Further, the metal in each void connects to a bottom of each memory hole of a respective group of memory holes. For instance, the metal portion 481 connects to the bottom of each of memory holes MH0-MH3 and the metal portion 482 connects to the bottom of each of memory holes MH8-MH11.

Support posts (such as example support post SP1) can optionally be provided to provide support for the layers in the stack. The support post are represented by squares to distinguish them from the memory holes in the figures, but can have a circular cross-section. The support posts extend through the stack and can be interspersed among the memory holes in a periodic pattern.

Optionally, additional slits (not shown) can be provided and used to replace a sacrificial material in the control gate layers. For example, the additional slits can be formed, and an etchant provided in the additional slits which removes the sacrificial material. A replacement material can then be provided via the additional slits. The additional slits are subsequently filled with insulation. When used, the fabrication of the additional slits can be independent of the fabrication of the slits used for the source contacts. In one approach, the sacrificial material in the control gate layers is replaced after the films are deposited in the memory holes. In other cases, the additional slits are not provided. In the example discussed in connection with FIG. 3C, the slits used to form the source contacts can also be used to provide the replacement material for the control gate layers.

Figure 5B:
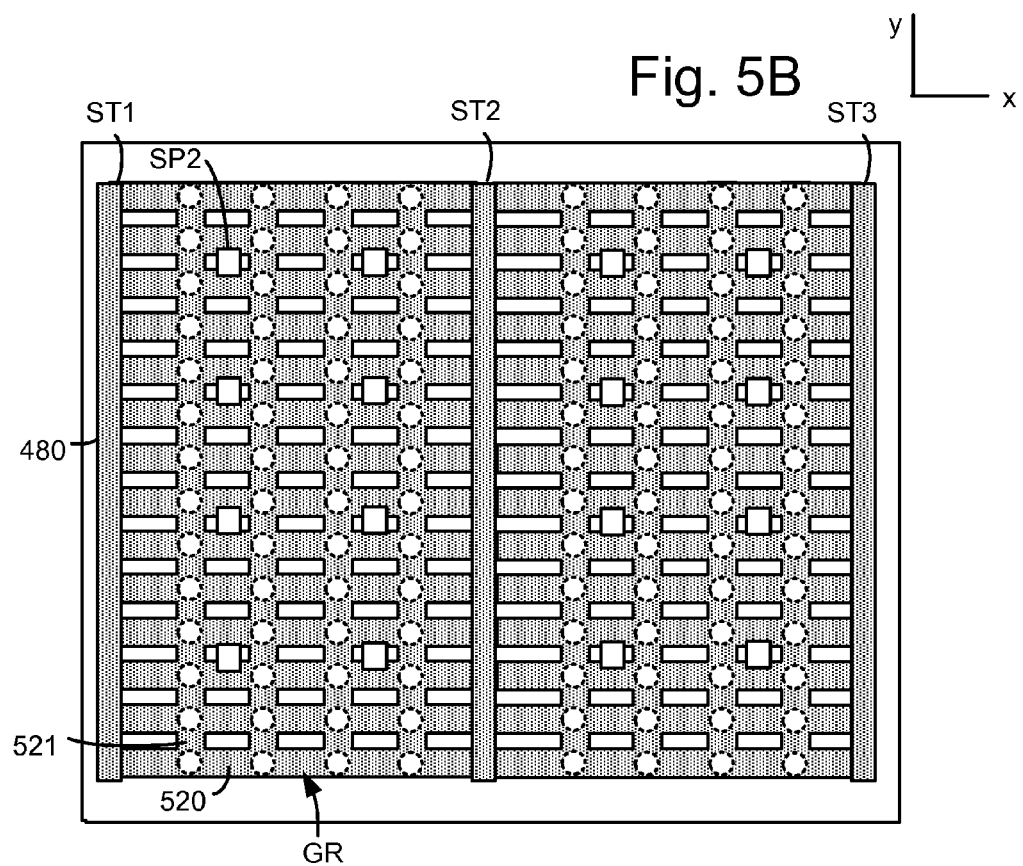
FIG. 5B depicts a second example pattern formed by the source contact material, as an alternative to FIG. 5A.

FIG. 5B depicts a second example pattern formed by the source contact material, as an alternative to FIG. 5A. In this example, the metal in the void in the substrate dielectric comprises a mesh or grid GR of conductive lines which extend in the x and y directions. For example, a line 520 extends in the x direction and a line 521 extends in the y direction.

Figure 5C:
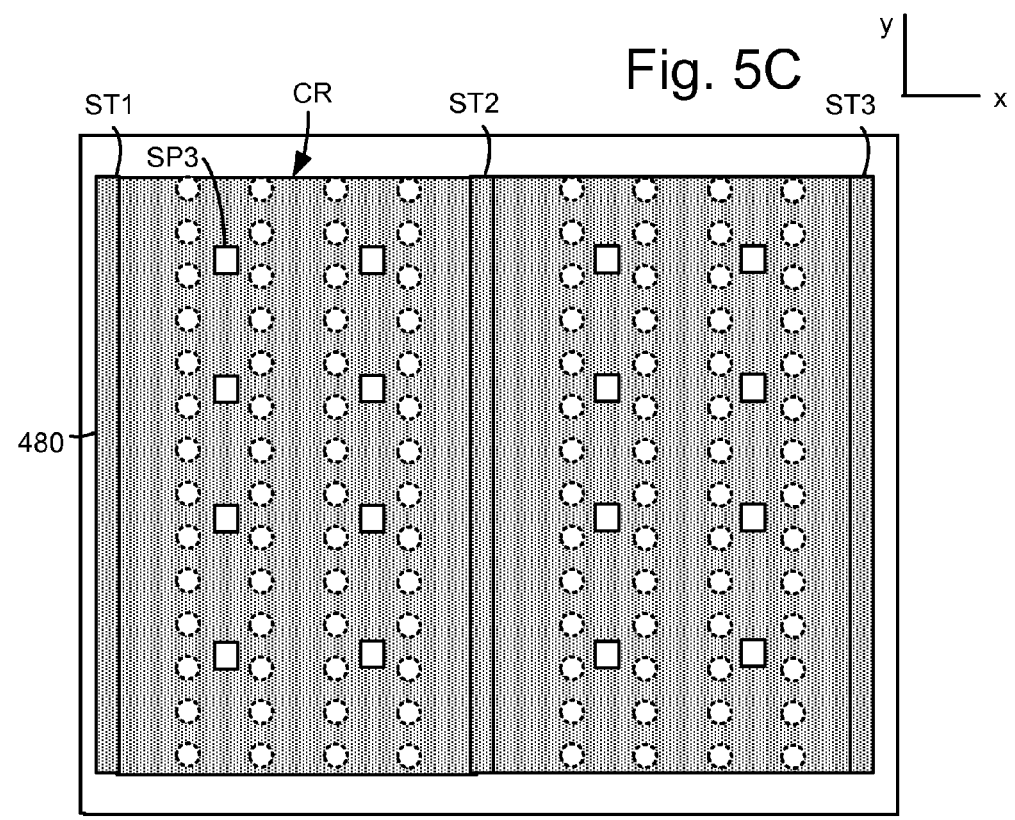
FIG. 5C depicts a third example pattern formed by the source contact material, as an alternative to FIG. 5A.

Support posts (such as example support post SP2), represented by squares, can optionally be provided, as discussed. FIG. 5C depicts a third example pattern formed by the source contact material, as an alternative to FIG. 5A. In this case, a substantially continuous region CR is provided between the slits. A larger metal region is desirable since the resistance is reduced in proportion to the volume of the metal region. Support posts (such as example support post SP3), represented by squares, can optionally be provided, as discussed.

FIG. 6A depicts an alternative semiconductor device in which a plurality of layers including a programmable film are formed at the bottom of a memory hole. The device provides an alternative to the configuration of FIG. 4C. A doped channel region 620 is formed in a substrate 601. Subsequently, the stack is deposited and a slit ST1a and a memory hole MH0a are etched in the stack, down to the doped channel region 620. A mask 660 is then provided over the slit to prevent memory films from entering the slit. Instead, the memory films 610 are deposited along the sidewalls and bottom of the memory hole. In particular, a memory film region 611 is at the bottom of the memory hole. An etchant is introduced into the memory hole to etch away the memory film region 611 at the bottom of the memory hole, and thereby expose a portion of the doped channel region. A small region at the top of the doped channel region may be etched away as well.

FIG. 6B depicts the alternative semiconductor device of FIG. 6A in which the layers are etched through to form an opening at the bottom of the memory hole. With the mask in place over the slit, the channel material 622 is deposited along the side of the memory film 610. Moreover, a portion 621 of the channel material 622 enters the etched away region at the top of the doped channel region, to form a contact to the doped channel region. However, it is difficult to make a good contact to the doped channel region using this approach and there is very limited scalability for smaller memory hole diameters. Subsequently, the dielectric material 630 is provided in the memory hole. The mask over the slit is removed and a mask, not shown, is placed over the memory hole, after which metal 640 is deposited in the slit to form a conductive vertical path to the doped channel region 620. The combination of the metal 640 and the doped channel region forms a conductive source contact to the bottom of the memory hole. A thin film transistor (TFT), not shown, can also be provided in the channel.

The second option, as discussed in connection with FIG. 3C, is described below.

FIG. 7A1 depicts a semiconductor device after step 353b of FIG. 3C. Initially, the sacrificial material 701 is formed in the dielectric layer 105 on the substrate. One or more initial layers of the stack are then deposited, such as DL0, DL1, SGSL and WLL0. The number of initial layers corresponds to the desired height of the etch stop material. After the initial layers are deposited, a portion of the stack is etched, creating an opening, and the etch stop material 710 is deposited in the opening. The etch stop material may be roughly twice as wide as a memory hole.

Figure 7B:
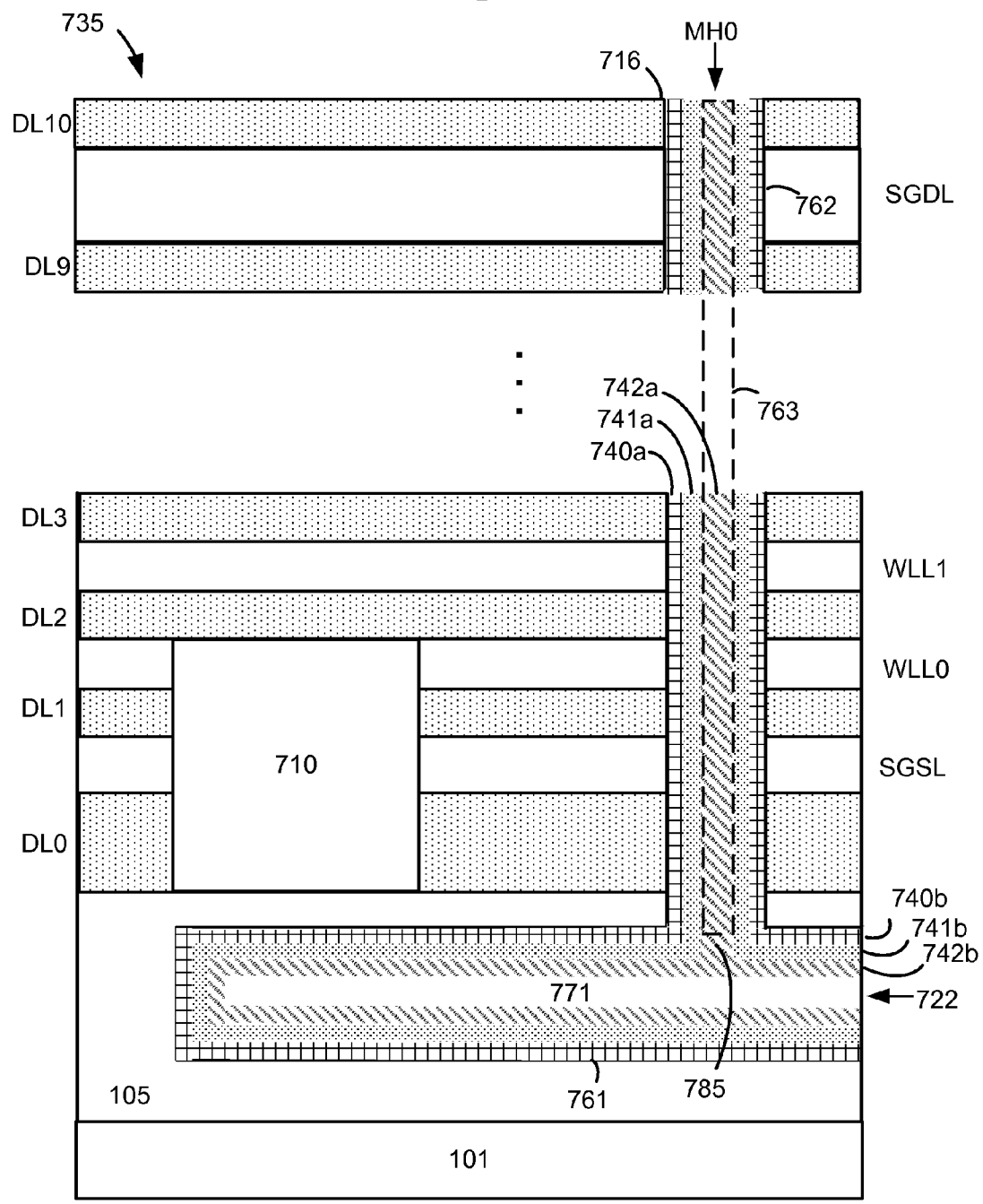
FIG. 7B depicts the semiconductor device of FIG. 7A2 after steps 355 to 359 of FIG. 3C.

FIG. 7A2 depicts the semiconductor device of FIG. 7A1 after step 354 of FIG. 3C. The semiconductor device is similar to that of FIG. 4B except the passageways have not yet been formed. Additionally, the etch stop material 710 is provided on the dielectric layer 105, within the stack. A region 735 is depicted in further detail in FIG. 7B.

FIG. 7B depicts the semiconductor device of FIG. 7A2 after steps 355 to 359 of FIG. 3C. The plurality of materials include an oxide-nitride-oxide set of films, a channel material and a dielectric material. Portions 740a and 740b of the ONO films are in the memory hole MH0 and void 722, respectively. Portions 741a and 741b of the channel material are in the memory hole and void, respectively. Portions 742a and 742b of the dielectric material are in the memory hole and void, respectively.

The materials coat the inner surfaces of the void 722 and memory holes, including a wall or inner surface 761 of the void and a wall or inner surface 762 of the memory hole. Since the cross-sectional dimension of the void is greater than that of the memory hole, the memory hole becomes filled by the dielectric material while an air gap 771 remains in the void. A dashed line 763 represents the portion of the dielectric material that fills the memory hole MH0. Each film coats an inner surface of the void and the memory hole, to form a continuous annular film which extends from a top 716 of the memory hole to the bottom 785 of the memory hole and through the void.

Figure 7C:
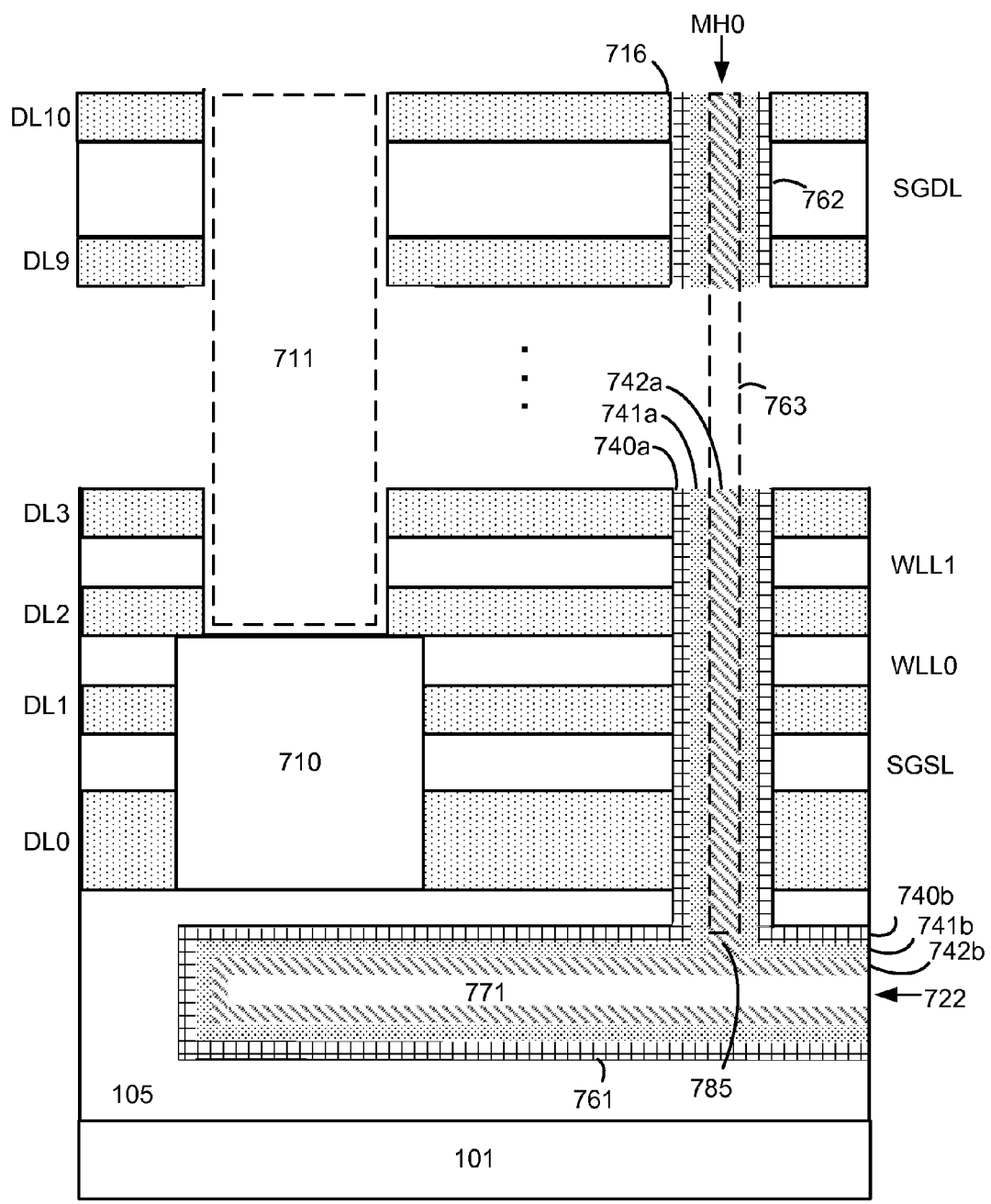
FIG. 7C depicts the semiconductor device of FIG. 7B after step 360 of FIG. 3C.

FIG. 7C depicts the semiconductor device of FIG. 7B after step 360 of FIG. 3C. An etching process such as reactive on etching involves etching through a portion of the stack until the etch stop material 710 is reached. This results in an opening 711 in the stack. By using an etch stop layer, the etching depth can be easily controlled. The etch stop material may be wider than the opening to provide a margin for error which prevents the opening from bypassing the etch stop material.

Figure 7D:
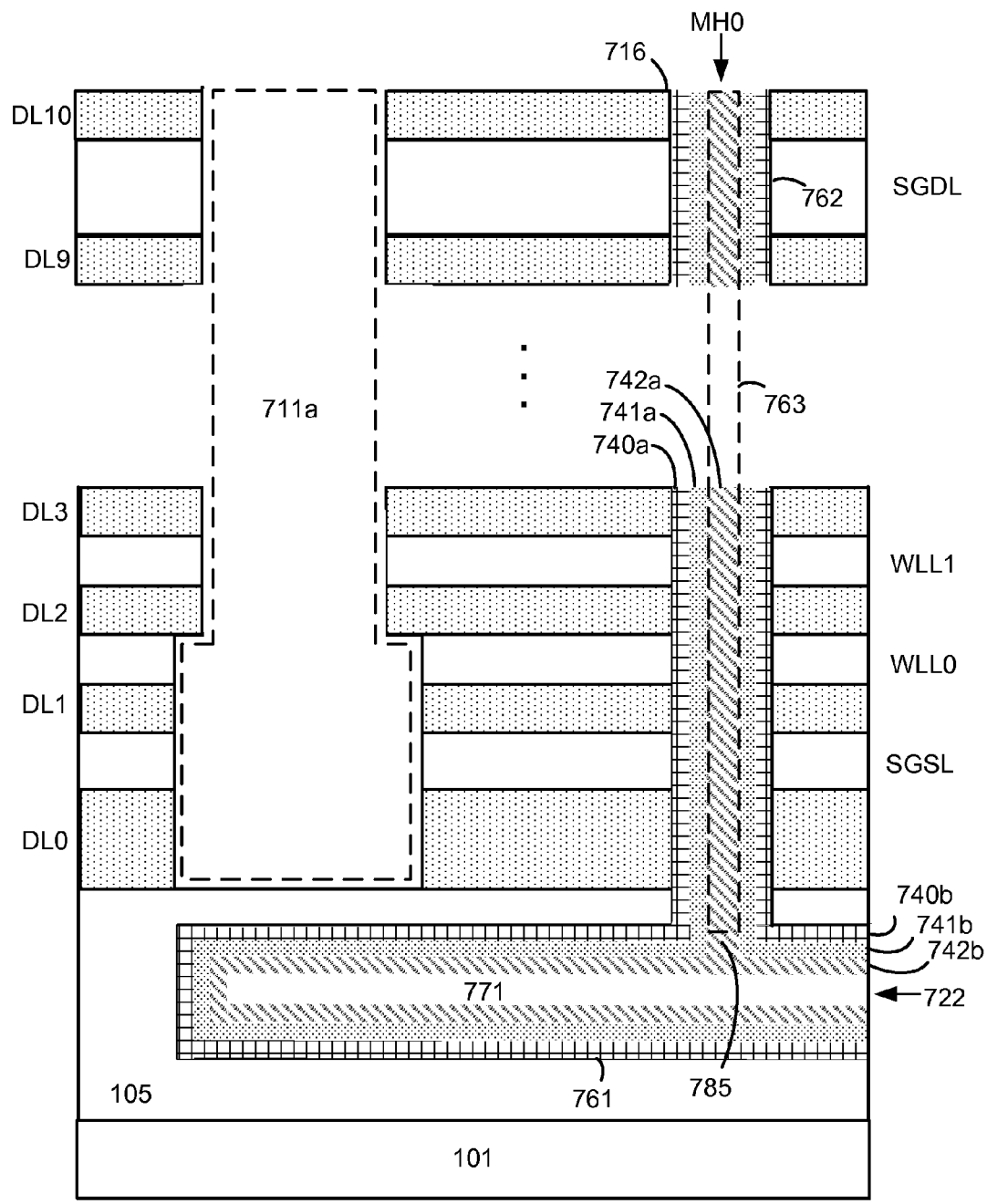
FIG. 7D depicts the semiconductor device of FIG. 7C after step 361 of FIG. 3C.

FIG. 7D depicts the semiconductor device of FIG. 7C after step 361 of FIG. 3C. The remaining etch stop material is removed so that the opening 711a extends down to the dielectric layer 105 on the substrate 101. The etch stop material is a sacrificial material. By removing the etch stop material, an opening which extends to the dielectric layer 105 can be easily formed. In contrast, etching through the stack directly and stopping at the dielectric layer 105 would be more difficult. At this point, the layers in the stack are readily accessible via the opening 711a for replacing the material of the control gate layers before accessing the void.

Figure 7E:
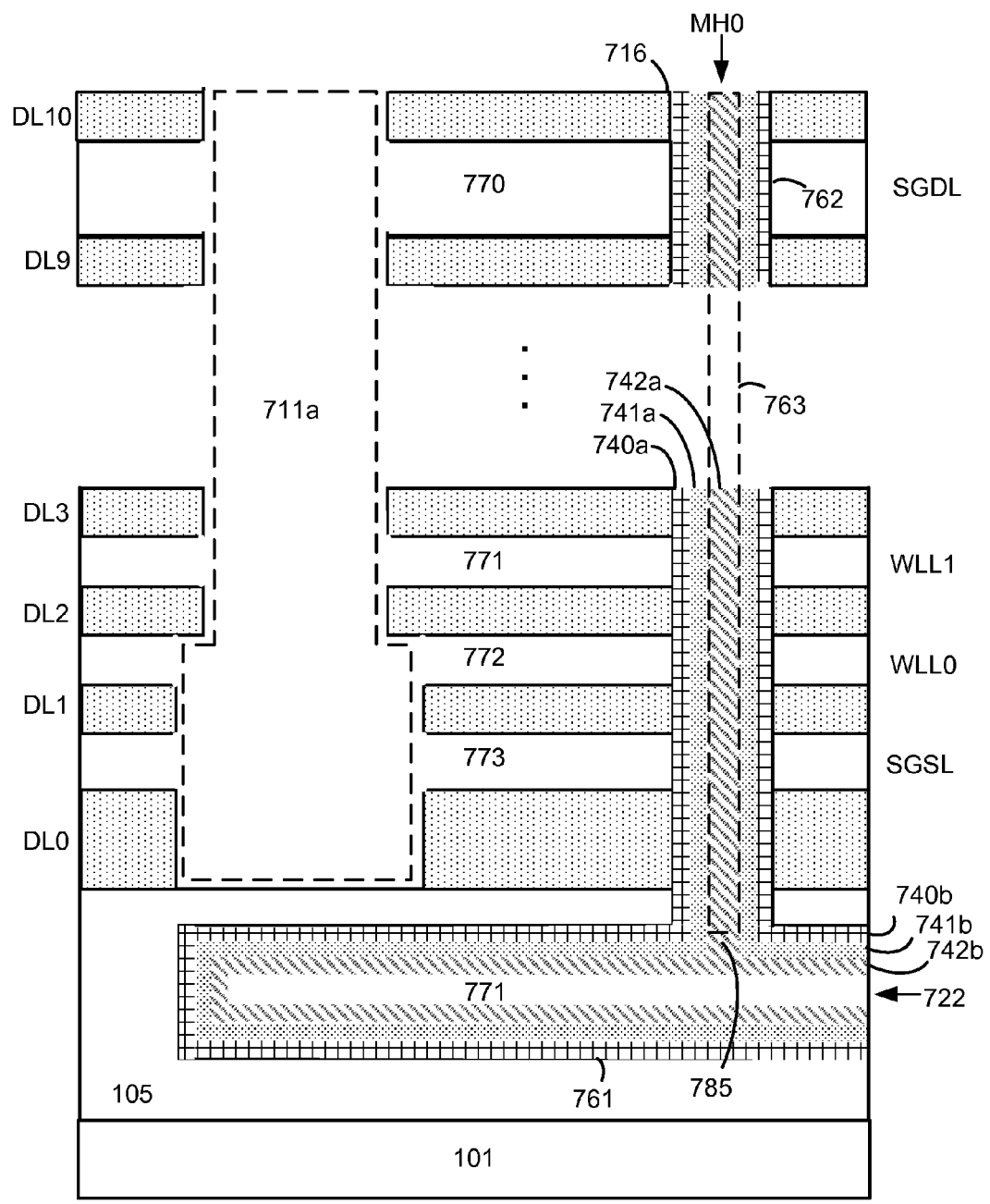
FIG. 7E depicts the semiconductor device of FIG. 7D after removing a sacrificial material of the control gate layers, consistent with step 362 of FIG. 3C.

FIG. 7E depicts the semiconductor device of FIG. 7D after removing a sacrificial material of the control gate layers, consistent with step 362 of FIG. 3C. For example, an etchant can be supplied to the opening 711 which etches away the material of the SGSL, WLL0, WLL1, ..., SGDL layers, resulting in voids between the dielectric layers DL0-DL10 of the stack, such as example voids 770-773.

Figure 7F:
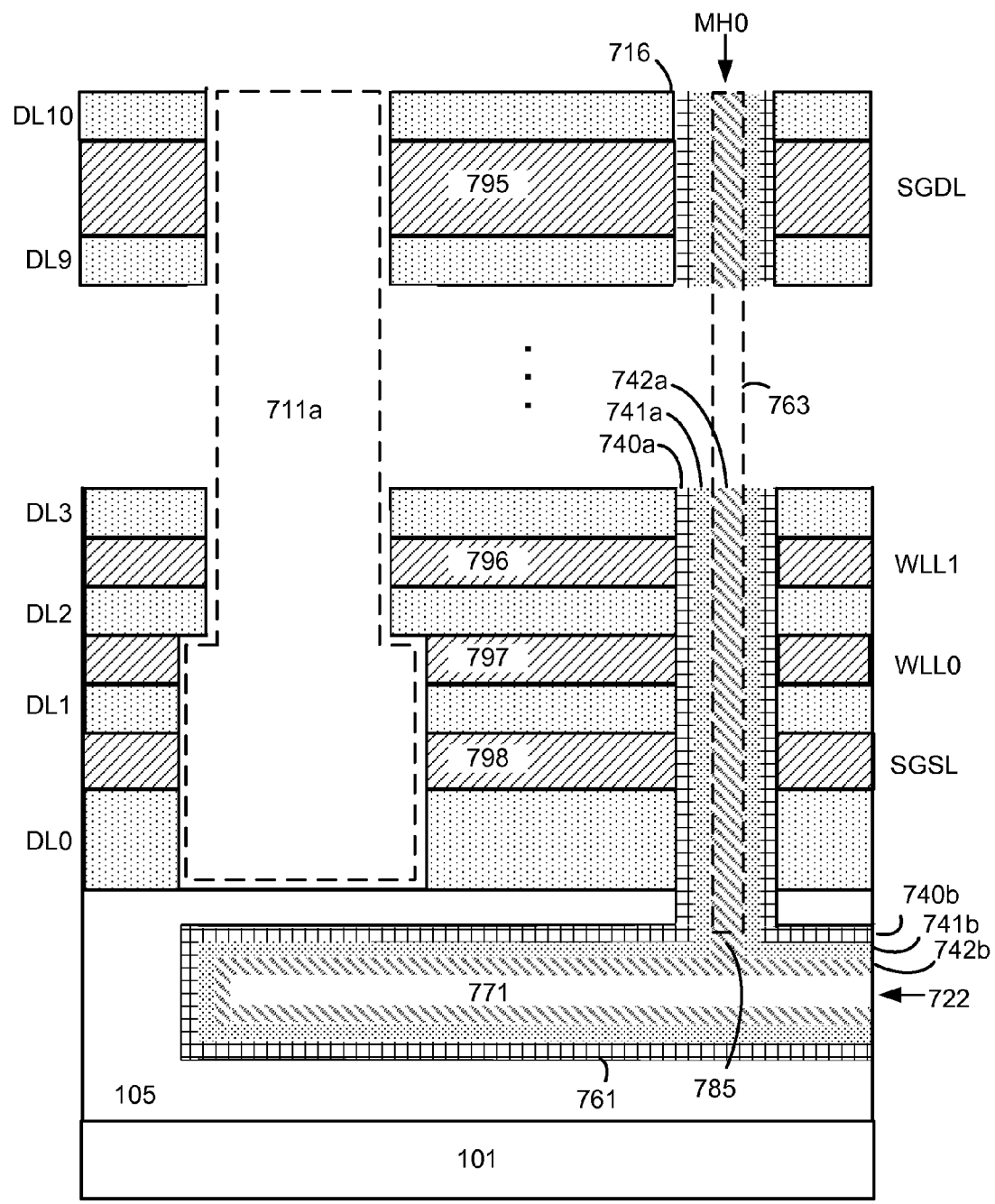
FIG. 7F depicts the semiconductor device of FIG. 7E after providing a replacement material for the control gate layers, consistent with step 362 of FIG. 3C.

FIG. 7F depicts the semiconductor device of FIG. 7E after providing a replacement material for the control gate layers, consistent with step 362 of FIG. 3C. A metal such as W can be deposited in the voids 770-773 via the opening 711 to provide the replacement material 795-798 (shown by a slanted line pattern) for the control gate layers.

Figure 7G:
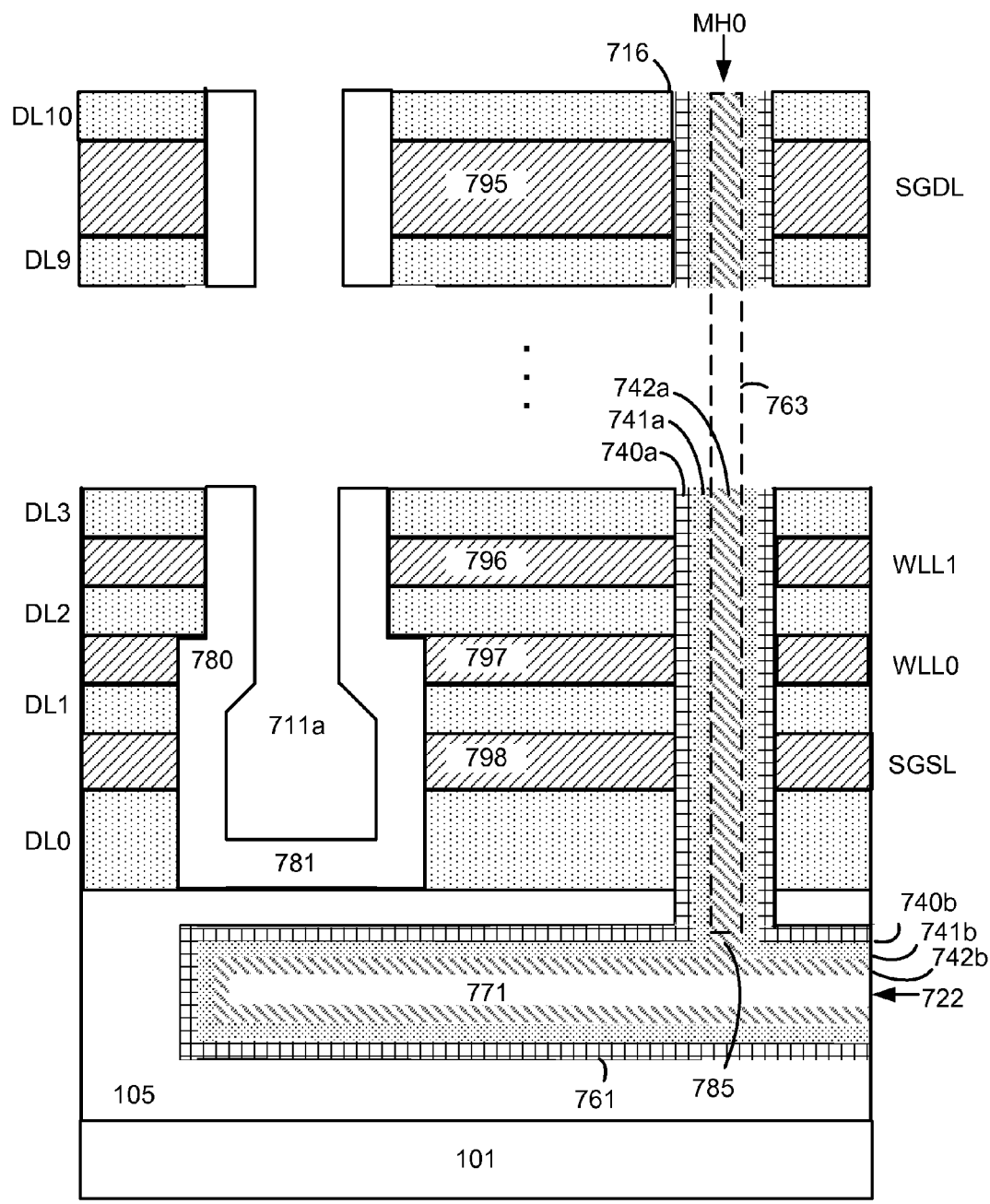
FIG. 7G depicts the semiconductor device of FIG. 7F after step 363 of FIG. 3C.

FIG. 7G depicts the semiconductor device of FIG. 7F after step 363 of FIG. 3C. A liner 780 having a bottom 781 is deposited in the opening.

FIG. 7H depicts the semiconductor device of FIG. 7G after step 364 of FIG. 3C. The etching process removes a region 799. A passageway PY is formed by the opening 711 in the stack and the region 798. The etching proceeds through the bottom of the liner, a the additional dielectric material 106 of the dielectric layer 105 which is above the void 722, the plurality of materials 740b, 741b and 742b at a top (T) of the void and optionally, the plurality of materials at a bottom (B) of the void. Piercing the top of the void is sufficient to form the passageway from the top of the stack to the void. Piercing the bottom of the void additionally is also acceptable. This allows a wider margin of error in the etching depth. The etching terminates before the substrate 101 is reached.

Note that the void 722 is shown as having a similar width or depth as the opening 711 in the figure for clarity. In practice, the opening 711 can be relatively narrower than the void so that the portion of the stack which is consumed by the opening is minimized. A larger void is desirable since it allows more metal to be deposited, resulting in a lower resistance.

Figure 7I:
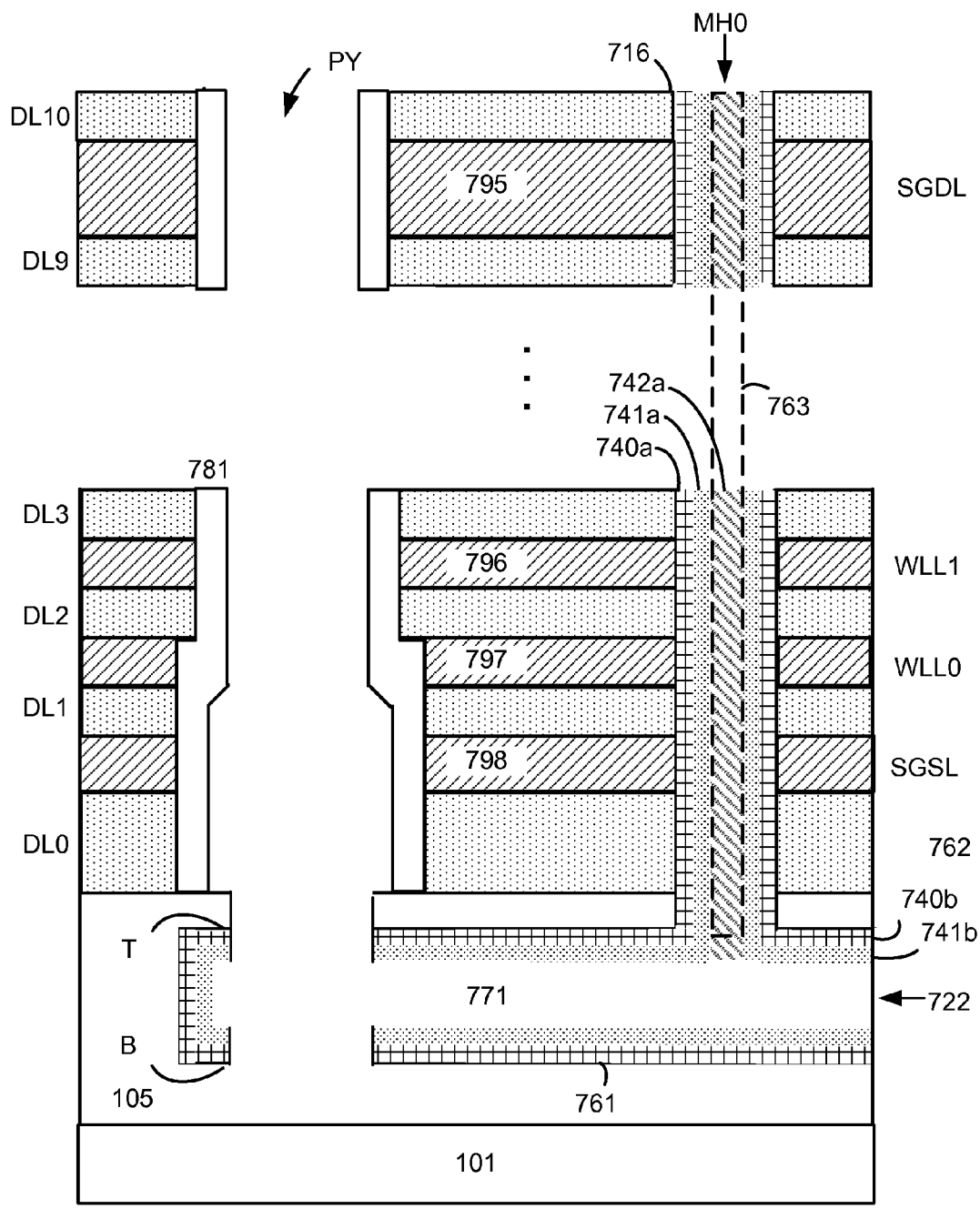
FIG. 7I depicts the semiconductor device of FIG. 7H after step 366 of FIG. 3C.

FIG. 7I depicts the semiconductor device of FIG. 7H after step 366 of FIG. 3C. The dielectric material 742b in the void 722 is removed by supplying an etchant via the passageway PY. The etchant may also remove some of the liner 780, resulting in a recessed liner 781.

Figure 7J:
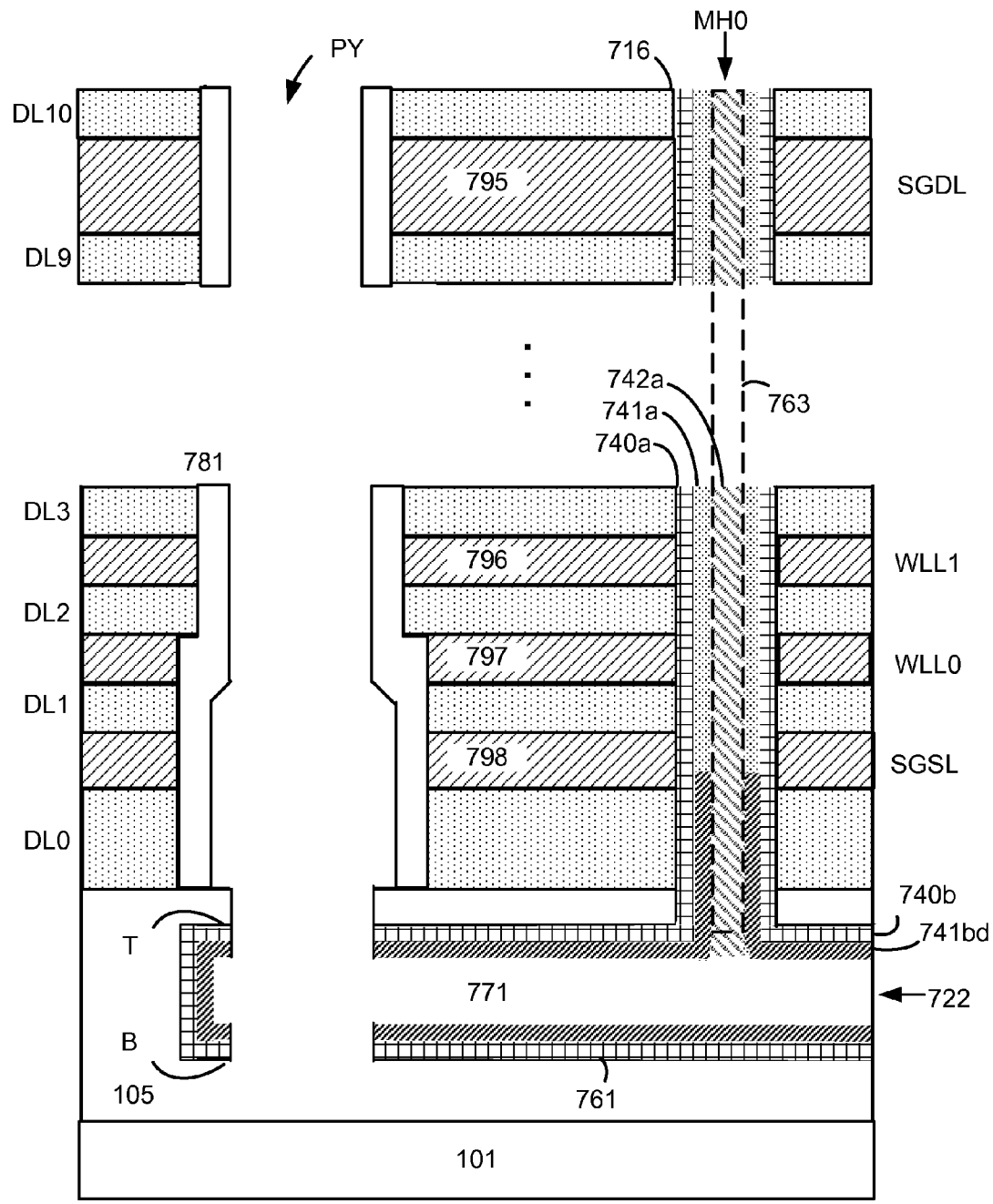
FIG. 7J depicts the semiconductor device of FIG. 7I after steps 320 and 321 of FIG. 3B.

FIG. 7J depicts the semiconductor device of FIG. 7I after steps 320 and 321 of FIG. 3B. The channel material 741b (FIG. 7I) in the void is doped to provide a doped channel material 741bd. After the doping, there is an option to deposit additional doped polysilicon on the doped channel material, as mentioned in connection with step 320a of FIG. 3B.

FIG. 7K depicts the semiconductor device of FIG. 7J after step 322 of FIG. 3B. Metal is deposited in the void and passageway, including a metal portion 790 in the void and a metal portion 791 in the passageway, forming a metal conductive path from the bottom 785 of the memory hole to the top (TP) of the stack. This is the contact to the source end of the memory hole.

Accordingly, it can be seen that one embodiment provides a method for fabricating a 3d stacked non-volatile memory device. The method includes: forming a memory hole in a stack, the stack comprising alternating control gate layers and dielectric layers on a substrate dielectric; forming a void in the substrate dielectric, a bottom of the memory hole is connected to the void; forming a passageway in the stack between a top of the stack and the void; depositing a plurality of materials in the void and the memory hole, the plurality of materials comprise a programmable material, a channel material and a dielectric material; removing a portion of the dielectric material which is in the void, exposing a portion of the channel material which is in the void; doping the portion of the channel material which is in the void, the doping comprises introducing a dopant to the void via the passageway; and depositing a metal in the void and the passageway, the metal extends to the bottom of the memory hole.

In another embodiment, a method for fabricating a 3d stacked non-volatile memory device includes: forming a memory hole in a stack, the stack comprising alternating control gate layers and dielectric layers on a substrate dielectric; forming a passageway in the stack; forming a void in the substrate dielectric by etching away a sacrificial material in the substrate dielectric using an etchant introduced via at least one of the passageway or the memory hole, the void connects a bottom of the passageway to a bottom of the memory hole; depositing a plurality of materials in the passageway, the void and the memory hole, the plurality of materials comprise a programmable material, a channel material and a dielectric material; removing a portion of the dielectric material which is in the void, exposing a portion of the channel material which is in the void, the removing comprises introducing an etchant into the void via the passageway; doping the portion of the channel material which is in the void, the doping comprises introducing a dopant to the void via the passageway; and depositing a metal in the void and the passageway, the metal extends to the bottom of the memory hole.

In another embodiment, a method for fabricating a 3d stacked non-volatile memory device includes: forming a memory hole in a stack, the stack comprising alternating control gate layers and dielectric layers on a substrate dielectric; forming a void in the substrate dielectric by etching away a sacrificial material in the substrate dielectric using an etchant introduced via the memory hole; depositing a plurality of materials in the void and the memory hole, the plurality of materials comprise a programmable material, a channel material and a dielectric material; forming a passageway in the stack which extends from a top of the stack to the void; removing a portion of the dielectric material which is in the void, exposing a portion of the channel material which is in the void, the removing comprises introducing an etchant into the void via the passageway; doping the portion of the channel material which is in the void, the doping comprises introducing a dopant to the void via the passageway; and depositing a metal in the void and the passageway, the metal extends to a bottom of the memory hole.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a 3d stacked non-volatile memory device, comprising:
   forming a memory hole in a stack, the stack comprising alternating control gate layers and dielectric layers on a substrate dielectric;
   forming a void in the substrate dielectric, a bottom of the memory hole is connected to the void;
   forming a passageway in the stack between a top of the stack and the void;
   depositing a plurality of materials in the void and the memory hole, the plurality of materials comprise a programmable material, a channel material and a dielectric material;
   removing a portion of the dielectric material which is in the void, exposing a portion of the channel material which is in the void;
   doping the portion of the channel material which is in the void, the doping comprises introducing a dopant to the void via the passageway; and
   depositing a metal in the void and the passageway, the metal extends to the bottom of the memory hole.

2. The method of claim 1, wherein:
   the removing the portion of the dielectric material in the void comprises introducing an etchant into the void via the passageway.

3. The method of claim 1, wherein:
   the forming the void in the substrate dielectric comprises etching away a sacrificial material in the substrate dielectric using an etchant introduced via at least one of the passageway or the memory hole.

4. The method of claim 1, wherein:
   the dielectric material fills the memory hole but does not fill the void.

5. The method of claim 1, wherein:
   the plurality of materials extend continuously throughout the memory hole and the void.

6. The method of claim 1, further comprising:
   applying heat after the doping, the heat causes the dopant to diffuse upwards in a portion of the channel material which is in the memory hole.

7. The method of claim 1, wherein:
   the void comprises a grid which connects a plurality of memory holes.

8. The method of claim 1, wherein:
   the passageway is formed before the plurality of materials are provided in the memory hole and the void; and the depositing of the plurality of materials occurs via the memory hole and via the passageway.

9. The method of claim 8, wherein:
the plurality of materials extend continuously throughout the memory hole, the void and the passageway.

10. The method of claim 1, wherein:
the passageway is formed after the plurality of materials are provided in the memory hole and the void; and
the depositing of the plurality of materials occurs via the memory hole but not via the passageway.

11. The method of claim 10, wherein:
the forming of the passageway comprises etching though the stack and piercing a portion of the plurality of materials which is in the void.

12. The method of claim 11, wherein:
an etch stop material is provided on the substrate dielectric within the stack; and
the etching through the stack comprises etching from the top of the stack to the etch stop material, removing a remainder of the etch stop material, depositing a liner and etching through a bottom of the liner before the piercing of the portion of the plurality of materials which is in the void.

13. The method of claim 11, further comprising:
providing a replacement material for the control gate layers after the etching though the stack and before the piercing the portion of the plurality of materials which is in the void.

14. The method of claim 1, wherein:
a NAND string is formed in the memory hole;
the NAND string comprises a source-side select gate transistor, a drain-side select gate transistor and a plurality of memory cells between the source-side select gate transistor and the drain-side select gate transistor;
a top control gate layer of the control gate layers is a control gate of the drain-side select gate transistor; and
a bottom control gate layer of the control gate layers is a control gate of the source-side select gate transistor.

15. The method of claim 1, wherein:
the programmable material comprises a charge trapping film;
the plurality of material comprise a block oxide and a tunnel oxide; and
the charge trapping film is between the block oxide and the tunnel oxide.

16. The method of claim 1, further comprising:
introducing additional doped material to the void via the passageway, after the doping the portion of the channel material which is in the void.

17. A method for fabricating a 3d stacked non-volatile memory device, comprising:
forming a memory hole in a stack, the stack comprising alternating control gate layers and dielectric layers on a substrate dielectric;
forming a passageway in the stack;
forming a void in the substrate dielectric by etching away a sacrificial material in the substrate dielectric using an etchant introduced via at least one of the passageway or the memory hole, the void connects a bottom of the passageway to a bottom of the memory hole;
depositing a plurality of materials in the passageway, the void and the memory hole, the plurality of materials comprise a programmable material, a channel material and a dielectric material;
removing a portion of the dielectric material which is in the void, exposing a portion of the channel material which is in the void, the removing comprises introducing an etchant into the void via the passageway;
doping the portion of the channel material which is in the void, the doping comprises introducing a dopant to the void via the passageway; and
depositing a metal in the void and the passageway, the metal extends to the bottom of the memory hole.

18. The method of claim 17, wherein:
a minimum cross-sectional dimension of the passageway and a minimum cross-sectional dimension of the void are larger than a minimum cross-sectional dimension of the memory hole, so that a gap exists in the passageway and in the void but not in the memory hole after the depositing of the dielectric material.

19. A method for fabricating a 3d stacked non-volatile memory device, comprising:
forming a memory hole in a stack, the stack comprising alternating control gate layers and dielectric layers on a substrate dielectric;
forming a void in the substrate dielectric by etching away a sacrificial material in the substrate dielectric using an etchant introduced via the memory hole;
depositing a plurality of materials in the void and the memory hole, the plurality of materials comprise a programmable material, a channel material and a dielectric material;
forming a passageway in the stack which extends from a top of the stack to the void;
removing a portion of the dielectric material which is in the void, exposing a portion of the channel material which is in the void, the removing comprises introducing an etchant into the void via the passageway;
doping the portion of the channel material which is in the void, the doping comprises introducing a dopant to the void via the passageway; and
depositing a metal in the void and the passageway, the metal extends to a bottom of the memory hole.

20. The method of claim 19, wherein:
an etch stop material is provided on the substrate dielectric within the stack; and
the forming of the passageway comprises etching from the top of the stack to the etch stop material, removing a remainder of the etch stop material, depositing a liner, etching through a bottom of the liner, and etching through a portion of the plurality of materials which is in the void.

* * * * *